(12) United States Patent
Jung

(10) Patent No.: US 11,954,340 B2
(45) Date of Patent: Apr. 9, 2024

(54) NONVOLATILE MEMORY DEVICE, NONVOLATILE MEMORY, AND OPERATION METHOD OF MEMORY CONTROLLER

(71) Applicant: SAMSUNG ELECTRONICS CO., LTD., Suwon-si (KR)

(72) Inventor: Bong-Kil Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 75 days.

(21) Appl. No.: 17/234,925

(22) Filed: Apr. 20, 2021

(65) Prior Publication Data

US 2022/0066667 A1 Mar. 3, 2022

(30) Foreign Application Priority Data

Aug. 31, 2020 (KR) .......................... 10-2020-0109952

(51) Int. Cl.
*G06F 3/00* (2006.01)
*G06F 3/06* (2006.01)

(52) U.S. Cl.
CPC .......... *G06F 3/0632* (2013.01); *G06F 3/0604* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 5,404,460 A | 4/1995 | Thomsen et al. | |
| 7,345,900 B2 | 3/2008 | Bartley et al. | |
| 7,617,350 B2 | 11/2009 | Bartley et al. | |
| 7,673,093 B2 | 3/2010 | Bartley et al. | |
| 7,925,854 B2 | 4/2011 | Oh et al. | |
| 9,390,049 B2 | 7/2016 | Lee et al. | |
| 2003/0185058 A1* | 10/2003 | LeClerg | G06F 13/1668 365/189.16 |
| 2009/0063786 A1 | 3/2009 | Oh | |
| 2012/0110244 A1 | 5/2012 | Feeley et al. | |
| 2012/0195148 A1 | 8/2012 | Yoko | |
| 2014/0173322 A1 | 6/2014 | Pyeon et al. | |
| 2019/0115052 A1 | 4/2019 | Seong et al. | |
| 2020/0090716 A1 | 3/2020 | Jung | |
| 2020/0379884 A1* | 12/2020 | Jung | G11C 16/08 |
| 2022/0391087 A1* | 12/2022 | Tang | G11C 8/12 |

FOREIGN PATENT DOCUMENTS

KR 20220056906 * 5/2022

* cited by examiner

*Primary Examiner* — Midys Rojas
(74) *Attorney, Agent, or Firm* — F. Chau & Associates, LLC

(57) ABSTRACT

Disclosed is a nonvolatile memory, which includes a plurality of input/output pads connectable to a plurality of data lines, an enable input pad, an enable output pad, and a chip address initialization circuit. The chip address initialization circuit receives a current chip address through the plurality of input/output pads, stores the current chip address in response to a current enable signal received through the enable input pad, outputs a next enable signal through the enable output pad, and outputs a next chip address through the plurality of input/output pads.

20 Claims, 15 Drawing Sheets

NONVOLATILE MEMORY DEVICE, NONVOLATILE MEMORY, AND OPERATION METHOD OF MEMORY CONTROLLER

CROSS-REFERENCE TO RELATED APPLICATIONS

This application claims priority under 35 U.S.C. § 119 to Korean Patent Application No. 10-2020-0109952 filed on Aug. 31, 2020, in the Korean Intellectual Property Office, the disclosure of which is incorporated by reference herein in its entirety.

FIELD

Embodiments of the present disclosure described herein relate to semiconductor memories, and more particularly, relate to a nonvolatile memory device, a nonvolatile memory, and an operation method of a memory controller.

DISCUSSION OF RELATED ART

A semiconductor memory device may be classified as a volatile memory device in which stored data may disappear after power is turned off, such as in a static random-access memory (SRAM) or in a dynamic random-access memory (DRAM); or may be classified as a nonvolatile memory device in which stored data are retained even significantly after power is turned off, such as in a flash memory device, a phase-change RAM (PRAM), a magnetic RAM (MRAM), a resistive RAM (RRAM), or a ferroelectric RAM (FRAM).

A nonvolatile memory device may be implemented in a multi-chip package. A plurality of nonvolatile memory chips may be packaged in one device. Chip addresses may be used to recognize the plurality of nonvolatile memory chips independently of each other. In this case, as pads for setting chip addresses may be additionally used, the size of a chip may increase.

SUMMARY

Embodiments of the present disclosure provide a nonvolatile memory device in which the area of a memory chip may be minimized, a nonvolatile memory, and an operation method of a memory controller.

According to an embodiment, a nonvolatile memory includes a plurality of input/output pads, an enable input pad, an enable output pad, and a chip address initialization circuit. The chip address initialization circuit receives a current chip address through the plurality of input/output pads, stores the current chip address in response to a current enable signal received through the enable input pad, outputs a next enable signal through the enable output pad, and outputs a next chip address through the plurality of input/output pads.

According to an embodiment, a nonvolatile memory device includes a plurality of nonvolatile memories connected with a plurality of data lines. A first nonvolatile memory of the plurality of nonvolatile memories includes a first plurality of input/output pads connected with the plurality of data lines, a first enable input pad, a first enable output pad, and a first chip address initialization circuit; and a second nonvolatile memory of the plurality of nonvolatile memories includes a second plurality of input/output pads connected with the plurality of data lines, a second enable input pad, a second enable output pad, and a second chip address initialization circuit. Each of the first and second chip address initialization circuits receives a current chip address through the plurality of input/output pads, generates a next chip address by using the current chip address, outputs a next enable signal through the corresponding enable output pad of the first and second enable output pads, and outputs the next chip address through the plurality of input/output pads, and the first enable output pad and the second enable input pad are connected.

According to an embodiment, an operation method of a memory controller which controls an external nonvolatile memory device including a plurality of nonvolatile memories connected with a plurality of data lines includes transmitting a chip address initialization command to the external nonvolatile memory device through the plurality of data lines in synchronization with a write enable signal, and transferring a first chip address through the plurality of data lines in synchronization with the write enable signal. The first chip address indicates a chip address of one of the plurality of nonvolatile memories, and a chip address of each of the plurality of nonvolatile memories is initialized by transmitting only the chip address initialization command and the first chip address.

BRIEF DESCRIPTION OF THE DRAWINGS

The above and other embodiments of the present disclosure will become apparent by describing in detail embodiments thereof with reference to the accompanying drawings.

DETAILED DESCRIPTION

Below, embodiments of the present disclosure may be described in detail to such an extent that those of ordinary skill in the pertinent art may easily implement these and other embodiments the present disclosure.

Figure 1:
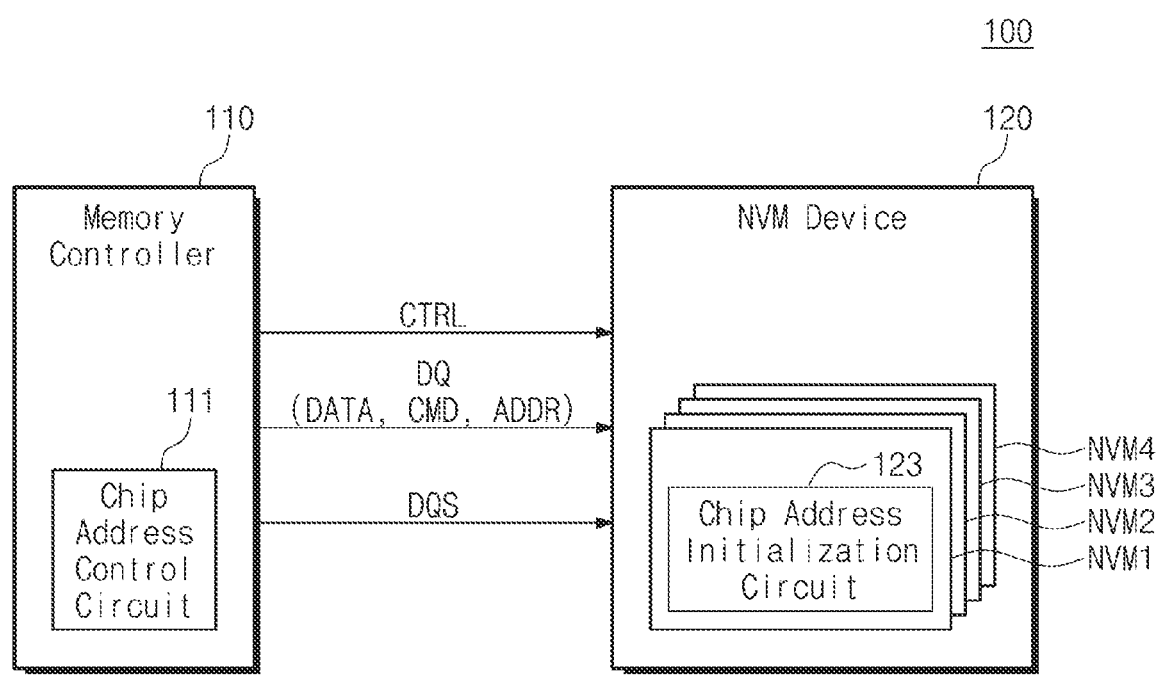
FIG. 1 is a block diagram illustrating a storage device according to an embodiment of the present disclosure.

FIG. 1 illustrates a storage device according to an embodiment of the present disclosure. Referring to FIG. 1, a storage device 100 may include a memory controller 110 and a nonvolatile memory (NVM) device 120. The memory controller 110 may be configured to process various requests from a host. For example, depending on a request of the host, the memory controller 110 may store data in the nonvolatile memory device 120 or may read data stored therein.

The memory controller 110 may store data DATA in the nonvolatile memory device 120. For example, the memory controller 110 may provide a command CMD, an address ADDR, and the data DATA to the nonvolatile memory device 120 through a plurality of data lines DQ. The memory controller 110 may further provide a control signal CTRL and a data strobe signal DQS to the nonvolatile memory device 120.

The memory controller 110 according to the present disclosure may include a chip address control circuit 111. In an embodiment, the chip address control circuit 111 may set or initialize a chip address of each of a plurality of nonvolatile memories NVM1 to NVM4. That is, the chip address control circuit 111 may transmit a chip address initialization command and a start chip address to the plurality of nonvolatile memories NVM1 to NVM4. In an embodiment, the chip address control circuit 111 may transmit the chip address initialization command (e.g., E2h) and the start chip address through the plurality of data lines DQ.

In an embodiment, the chip address control circuit 111 of the memory controller 110 according to the present disclosure need not transmit all chip addresses of the plurality of nonvolatile memories NVM1 to NVM4. That is, the chip address control circuit 111 may transmit the chip address initialization command to the plurality of nonvolatile memories NVM1 to NVM4 and may then transmit a start chip address being a chip address of a start nonvolatile memory (e.g., the first nonvolatile memory NVM1) being one of the plurality of nonvolatile memories NVM1 to NVM4. A chip address of each of the remaining nonvolatile memories (e.g., the second to fourth nonvolatile memories NVM2 to NVM4) except the start nonvolatile memory may be transmitted by any other nonvolatile memory.

Under control of the memory controller 110, the nonvolatile memory device 120 may store data or may output the stored data. The nonvolatile memory device 120 may include the plurality of nonvolatile memories NVM1 to NVM4. In an embodiment, each of the plurality of nonvolatile memories NVM1 to NVM4 may include a NAND flash memory. However, the present disclosure is not limited thereto. For example, each of the plurality of nonvolatile memories NVM1 to NVM4 may include at least one of various memory devices such as a read-only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

The nonvolatile memory device 120 may be a multi-chip package (MCP). For example, the nonvolatile memory device 120 may be implemented by installing a plurality of chips having substantially the same structure in one package. Each of the plurality of nonvolatile memories NVM1 to NVM4 may have a unique chip address. Chip addresses may be used as identifiers capable of recognizing the plurality of nonvolatile memories NVM1 to NVM4 independently of each other. A chip address may indicate a nonvolatile memory, to which the command CMD, the data DATA, and the address ADDR input to the nonvolatile memory device 120 are to be transmitted, from among the plurality of nonvolatile memories NVM1 to NVM4.

Each of the plurality of nonvolatile memories NVM1 to NVM4 according to an embodiment of the present disclosure may include a chip address initialization circuit 123. The chip address initialization circuit 123 may perform a chip address initialization operation in response to the received chip address initialization command. The chip address initialization circuit 123 may store the received chip address. The chip address initialization circuit 123 may generate a next chip address by using the received chip address. The chip address initialization circuit 123 may output a next chip address in synchronization with a next initialization enable signal. In an embodiment, the next initialization enable signal may be provided to a next nonvolatile memory as a clock capable of latching the next chip address.

In an embodiment, the nonvolatile memory device 120 may set a start chip address received from the memory controller 110 as a chip address of a start nonvolatile memory (e.g., the first nonvolatile memory NVM1) being one of the plurality of nonvolatile memories NVM1 to NVM4. Each of the remaining nonvolatile memories (e.g., NVM2 to NVM4) except the start nonvolatile memory (e.g., NVM1) may store its own chip address in response to a chip address and an initialization enable signal that a previous nonvolatile memory generates.

In other words, the start nonvolatile memory may store the start chip address received from the memory controller 110, and each of the remaining nonvolatile memories except the start nonvolatile memory may store a chip address received from a previous nonvolatile memory.

In an embodiment, the chip address initialization operation may indicate an operation in which, in response to the chip address initialization command and the start chip address received from the memory controller 110, the start nonvolatile memory stores the start chip address and each of the remaining nonvolatile memories stores a chip address that a previous nonvolatile memory generates. The chip address initialization operation of the storage device 100 according to an embodiment of the present disclosure may be more fully described with reference to the following drawings.

Figure 2:
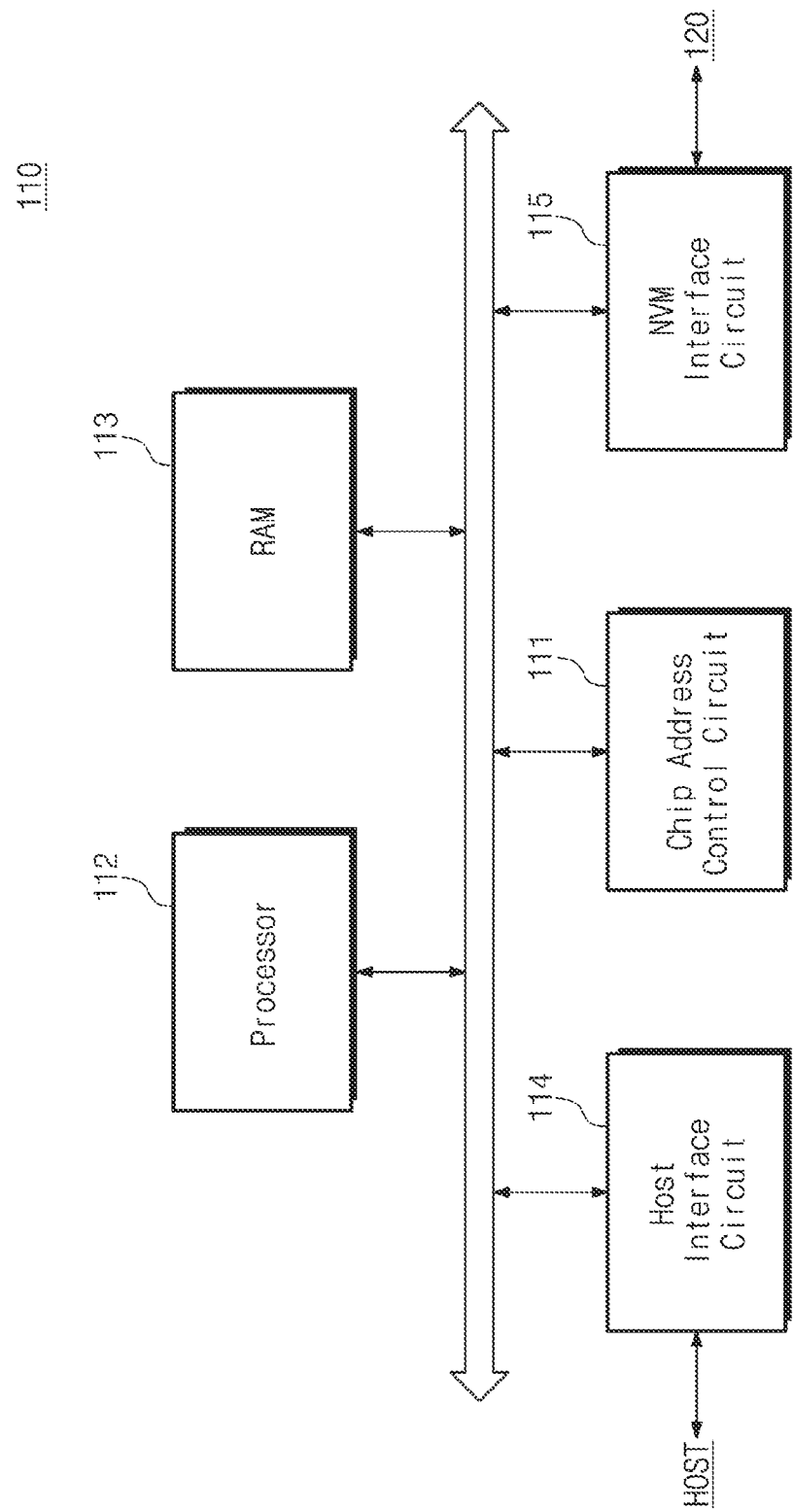
FIG. 2 is a block diagram illustrating a memory controller of FIG. 1.

FIG. 2 illustrates a memory controller of FIG. 1. Referring to FIGS. 1 and 2, the memory controller 110 may include the chip address control circuit 111, a processor 112, a random-access memory (RAM) 113, a host interface circuit 114, and a nonvolatile memory interface circuit 115.

The chip address control circuit 111 may sense or detect that an initialization operation is being performed. The chip address control circuit 111 may receive chip address setting information. In an embodiment, the chip address setting information may include information indicating that the nonvolatile memory device 120 is a multi-chip package or information about the number of nonvolatile memories NVM in the nonvolatile memory device 120. The chip address control circuit 111 may set a chip address of each of the nonvolatile memories NVM in the nonvolatile memory device 120 by using the chip address setting information.

In the initialization operation, the chip address control circuit 111 according to an embodiment of the present disclosure may transmit a chip address initialization command and a start chip address through the nonvolatile memory interface circuit 115. That is, the chip address control circuit 111 may transmit a chip address initialization request to the nonvolatile memory device 120 by transmitting the chip address initialization command and the start chip address.

In an embodiment, the memory controller 110 may receive a notification indicating that the chip address initialization operation is completed, from the nonvolatile memory device 120. The memory controller 110 may receive an initialization complete signal from the nonvolatile memory device 120. This may be described in greater detail with reference to FIGS. 5 and 7.

The memory controller 110 may recognize that the chip address initialization operation is completed through a status read operation. The memory controller 110 may transmit a status read command with respect to the plurality of nonvolatile memories NVM1 to NVM4. The memory controller 110 may transmit a chip select command, a chip address, and a status read command for each of the nonvolatile memories NVM1 to NVM4. The memory controller 110 may receive status information from the plurality of nonvolatile memories NVM1 to NVM4. The memory controller 110 may determine whether a chip address is correctly set through the status information.

To transmit a read or write request, the memory controller 110 may select one of the plurality of nonvolatile memories NVM1 to NVM4. Before transmitting a read or write command, the memory controller 110 may transmit a chip select command and a chip address of a nonvolatile memory to be selected.

The processor 112 may control overall operations of the memory controller 110. Alternatively, the processor 112 may be configured to perform various operations necessary for the memory controller 110 to operate.

The RAM 113 may be configured to store a variety of information necessary for the memory controller 110 to operate. The RAM 113 may be used as a buffer memory, a cache memory, or a working memory of the memory controller 110.

The host interface circuit 114 may communicate with the host in compliance with a given communication protocol. The host interface circuit 114 may be implemented based on the given interface protocol. In an embodiment, the given interface protocol may include at least one of various interfaces such as a Serial ATA (SATA) interface, a Peripheral Component Interconnect Express (PCIe) interface, a Serial Attached SCSI (SAS) interface, a Nonvolatile Memory express (NVMe) interface, and a Universal Flash Storage (UFS) interface.

The nonvolatile memory interface circuit 115 may communicate with the nonvolatile memory device 120 in compliance with a given interface protocol. In an embodiment, the nonvolatile memory interface circuit 115 may provide a plurality of channels that are physically separated from each other. In an embodiment, the given interface protocol associated with the nonvolatile memory interface circuit 115 may be a NAND interface.

In an embodiment, the nonvolatile memory interface circuit 115 may communicate with the nonvolatile memory device 120 through a first channel. The nonvolatile memory interface circuit 115 may output the chip address initialization command and the start chip address through the plurality of data lines DQ in synchronization with a rising edge of a write enable signal WE/.

Figure 3:
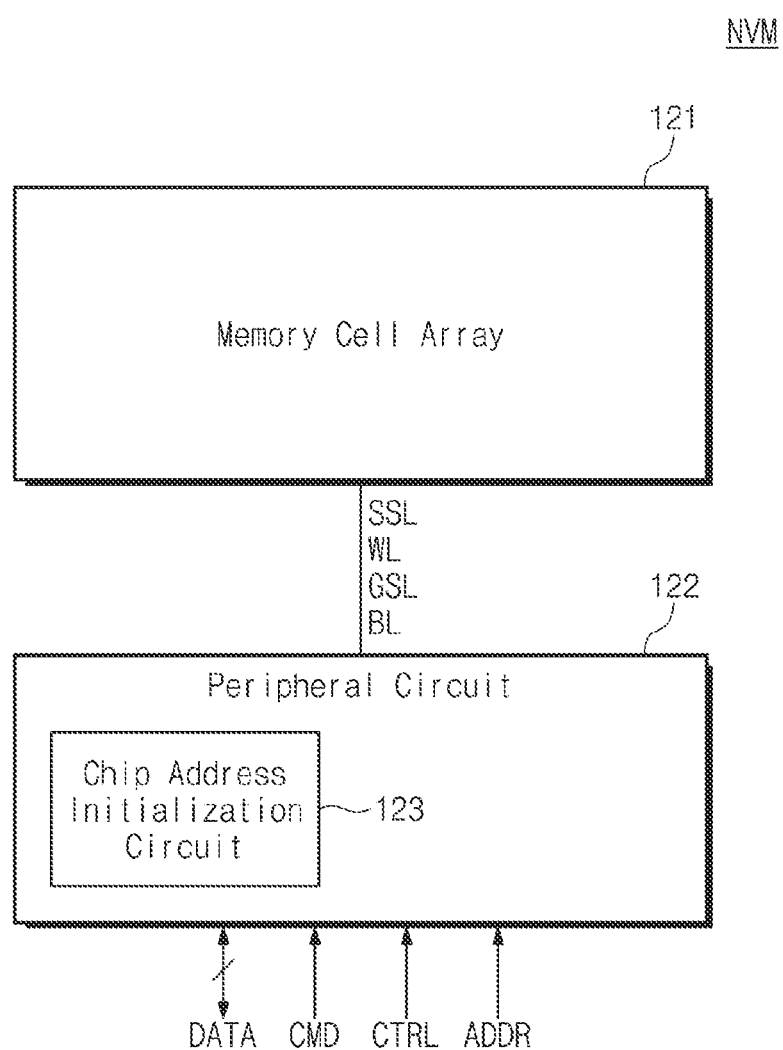
FIG. 3 is a block diagram illustrating nonvolatile memory of FIG. 1.

FIG. 3 illustrates nonvolatile memory of FIG. 1. Below, for convenience of description, it may be assumed that a nonvolatile memory NVM is a NAND flash memory. However, the present disclosure is not limited thereto.

Referring to FIGS. 1 and 3, the nonvolatile memory NVM may include a memory cell array 121 and a peripheral circuit 122. The memory cell array 121 may include a plurality of memory blocks. Each of the plurality of memory blocks may be connected with the peripheral circuit 122 through word lines WL, string selection lines SSL, ground selection lines GSL, and bit lines BL.

The peripheral circuit 122 may receive the address ADDR, the command CMD, and the control signal CTRL from the memory controller 110 and may exchange the data DATA with the memory controller 110 in response to the received signals. For example, the peripheral circuit 122 may include an address decoder, control logic, a page buffer circuit, an input/output circuit, the chip address initialization circuit 123.

The chip address initialization circuit 123 may store a received chip address. The chip address initialization circuit 123 may generate a next chip address by using the received chip address. The chip address initialization circuit 123 may output the next chip address in synchronization with a rising edge of an initialization enable signal. The chip address initialization circuit 123 may be more fully described with reference to the following drawings.

Figure 4:
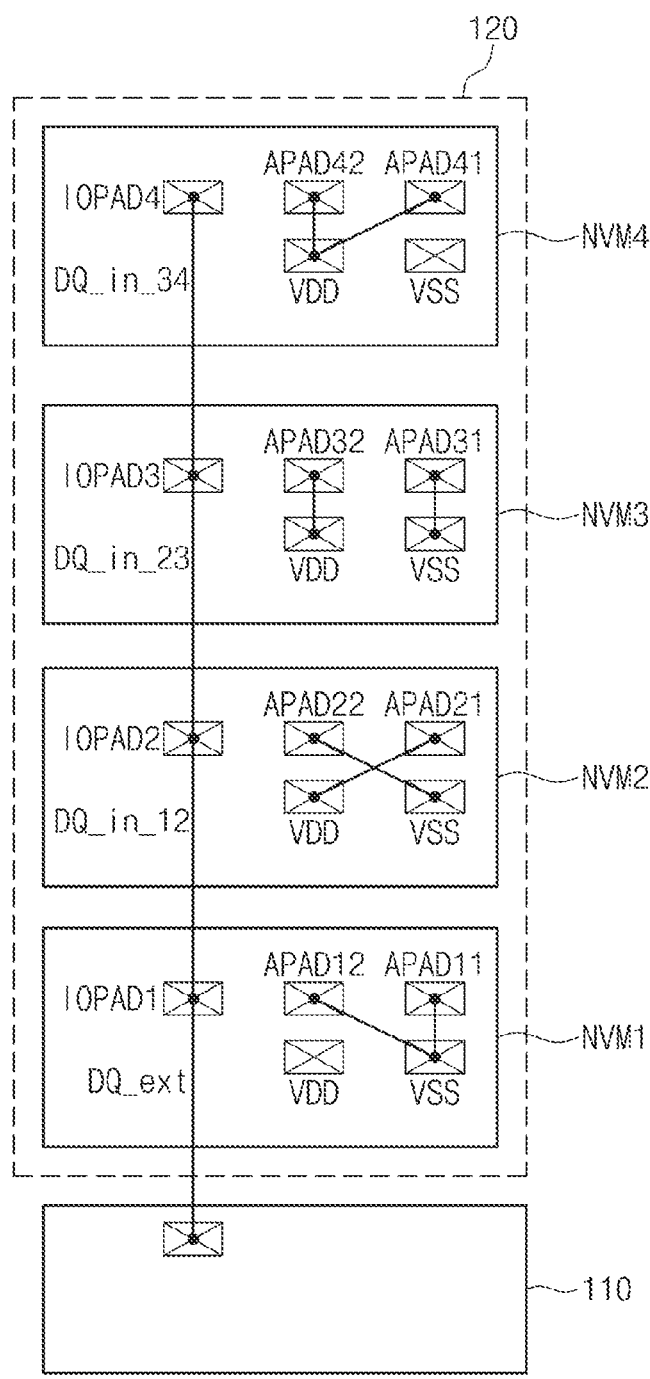
FIG. 4 is a schematic diagram for describing a nonvolatile memory device of FIG. 1.

FIG. 4 illustrates a nonvolatile memory device of FIG. 1. For brevity of drawing and convenience of description, it may be assumed that the nonvolatile memory device 120 includes the first to fourth nonvolatile memories NVM1 to NVM4. However, the present disclosure is not limited thereto.

In an embodiment, the first to fourth nonvolatile memories NVM1 to NVM4 may be stacked in a height direction being a direction perpendicular to a plane. For example, the first nonvolatile memory NVM1 may be present in the lowest layer, the second nonvolatile memory NVM2 may be stacked on the first nonvolatile memory NVM1, the third nonvolatile memory NVM3 may be stacked on the second nonvolatile memory NVM2, and the fourth nonvolatile memory NVM4 may be stacked on the third nonvolatile memory NVM3. However, the present disclosure is not limited thereto.

Each of the plurality of nonvolatile memories NVM1 to NVM4 may include a plurality of pads. One nonvolatile memory may communicate with any other nonvolatile memory or a memory controller through the plurality of pads. The plurality of pads may be connected with each other through wires between a plurality of nonvolatile memories.

The plurality of pads may include input/output pads IOPAD, a write enable signal (WE/) pad, and the like. The input/output pads IOPAD may be connected with the plurality of data lines DQ and may be used to transmit a command, an address, or data. The write enable signal (WE/) pad may be used to transmit a clock for transmitting a command, an address, or data.

In an embodiment, each of the plurality of nonvolatile memories NVM1 to NVM4 may include the input/output pads IOPAD and first and second address pads. That is, the first nonvolatile memory NVM1 may include the first input/output pads IOPAD1 and first and second address pads APAD11 and APAD12, the second nonvolatile memory NVM2 may include the second input/output pads IOPAD2 and first and second address pads APAD21 and APAD22, the third nonvolatile memory NVM3 may include the third input/output pads IOPAD3 and first and second address pads APAD31 and APAD32, and the fourth nonvolatile memory NVM4 may include the fourth input/output pads IOPAD4 and first and second address pads APAD41 and APAD42.

The memory controller 110 and the plurality of nonvolatile memories NVM1 to NVM4 may be connected with each other through the plurality of data lines DQ. For convenience, the description may be given as the plurality of data lines DQ are divided into a plurality of internal data lines DQ_in_12, DQ_in_23, DQ_in_34 and a plurality of external data lines DQ_ext. That is, the plurality of data lines DQ may be divided into the plurality of internal data lines DQ_in_12, DQ_in_23, DQ_in_34 and the plurality of external data lines DQ_ext.

A signal that is output through the plurality of internal data lines DQ_in_12, DQ_in_23, DQ_in_34 may be provided to a plurality of different internal data lines and the plurality of external data lines DQ_ext. A signal that is output through the plurality of external data lines DQ_ext may be provided to the plurality of internal data lines DQ_in_12, DQ_in_23, DQ_in_34.

Input/output pads of the memory controller 110 and the first input/output pads IOPAD1 of the first nonvolatile memory NVM1 may be connected through the plurality of external data lines DQ_ext. The first input/output pads IOPAD1 of the first nonvolatile memory NVM1 and the second input/output pads IOPAD2 of the second nonvolatile memory NVM2 may be connected through the plurality of internal data lines DQ_in_12. The second input/output pads IOPAD2 of the second nonvolatile memory NVM2 and the third input/output pads IOPAD3 of the third nonvolatile memory NVM3 may be connected through the plurality of internal data lines DQ_in_23. The third input/output pads IOPAD3 of the third nonvolatile memory NVM3 and the fourth input/output pads IOPAD4 of the fourth nonvolatile memory NVM4 may be connected through the plurality of internal data lines DQ_in_34.

That is, the plurality of external data lines DQ_ext and the plurality of internal data lines DQ_in_12, DQ_in_23, DQ_in_34 may be interconnected to transmit/receive the same data, the same command, the same address, and the like.

The memory controller 110 may recognize a plurality of nonvolatile memories through a plurality of chip enable signals CE/. However, in the case of a storage device having an 8-channel, 8-way structure, 64 chip enable signals CE/are used to recognize a total of 64 nonvolatile memories. An increase in the number of chip enable signals CE/may make a routing space insufficient. To solve this issue, a chip address may be allocated for each nonvolatile memory.

The first to fourth nonvolatile memories NVM1 to NVM4 may be recognized through a chip address. To recognize the first to fourth nonvolatile memories NVM1 to NVM4, a chip address may require at least two bits. That is, a chip address of "00" may be allocated to the first nonvolatile memory NVM1, a chip address of "01" may be allocated to the second nonvolatile memory NVM2, a chip address of "10" may be allocated to the third nonvolatile memory NVM3, and a chip address of "11" may be allocated to the fourth nonvolatile memory NVM4.

A chip address of each of nonvolatile memories may be allocated by connecting each chip address pad to a power supply voltage VDD or a ground voltage VSS in packaging. For example, a chip address of "00" may be allocated to the first nonvolatile memory NVM1 by connecting both the first address pad APAD11 and the second address pad APAD12 of the first nonvolatile memory NVM1 to the ground voltage VSS. A chip address of "01" may be allocated to the second nonvolatile memory NVM2 by connecting the first address pad APDA21 and the second address pad APAD22 of the second nonvolatile memory NVM2 to the power supply voltage VDD and the ground voltage VSS, respectively. A chip address of "10" may be allocated to the third nonvolatile memory NVM3 by connecting the first address pad APDA31 and the second address pad APAD32 of the third nonvolatile memory NVM3 to the ground voltage VSS and the power supply voltage VDD, respectively. A chip address of "11" may be allocated to the fourth nonvolatile memory NVM4 by connecting both the first address pad APDA41 and the second address pad APAD42 of the fourth nonvolatile memory NVM4 to the power supply voltage VDD.

As described above, to allocate chip addresses to the first to fourth nonvolatile memories NVM1 to NVM4 of the nonvolatile memory device 120, each of the first to fourth nonvolatile memories NVM1 to NVM4 may require 2 pads, and the nonvolatile memory device 120 may require 8 pads.

For example, assuming that a nonvolatile memory device includes 16 nonvolatile memories, each of the 16 nonvolatile memories may require 4 pads, and the nonvolatile memory device may require 64 pads. As such, as the number of nonvolatile memories packaged in a nonvolatile memory device increases, the number of necessary pads may increase. This causes an increase in the size of a chip.

Figure 5:
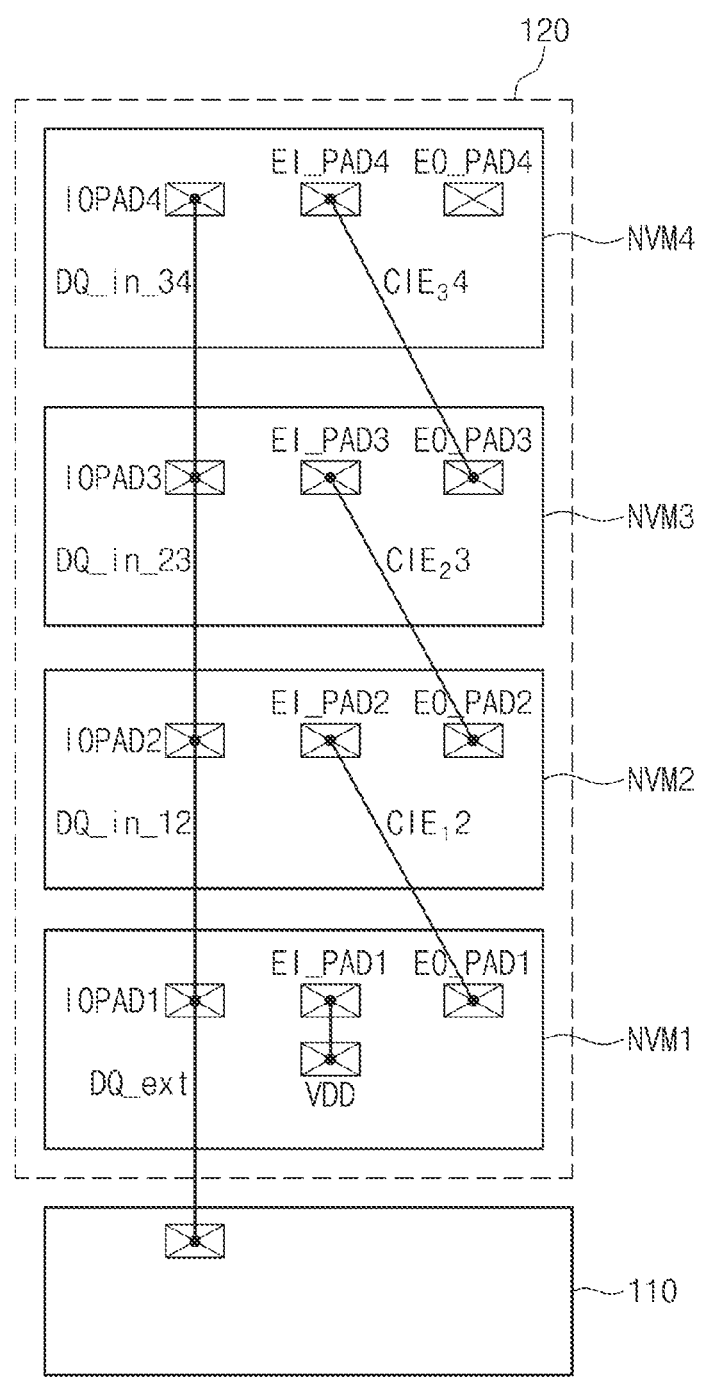
FIG. 5 is a schematic diagram for describing a nonvolatile memory device of FIG. 1.

FIG. 5 illustrates a nonvolatile memory device of FIG. 1. It may be assumed that the nonvolatile memory device 120 includes the first to fourth nonvolatile memories NVM1 to NVM4. However, the present disclosure is not limited thereto. The stack structure of the nonvolatile memory device 120 is described with reference to FIG. 5, and thus, additional description may be omitted to avoid redundancy.

For brevity of drawing and convenience of description, discussion of the write enable signal (WE/) pad, the chip enable signal (CE/) pad, and the like may be omitted. In an embodiment, each of the plurality of nonvolatile memories NVM1 to NVM4 may include the input/output pads IOPAD, an enable input pad EI_PAD, and an enable output pad EO_PAD.

For example, the first nonvolatile memory NVM1 may include the first input/output pads IOPAD1, a first enable input pad EI_PAD1, and a first enable output pad EO_PAD1, the second nonvolatile memory NVM2 may include the second input/output pads IOPAD2, a second enable input pad EI_PAD2, and a second enable output pad EO_PAD2, the third nonvolatile memory NVM3 may include the third input/output pads IOPAD3, a third enable input pad EI_PAD3, and a third enable output pad EO_PAD3, and the fourth nonvolatile memory NVM4 may include the fourth input/output pads IOPAD4, a fourth enable input pad EI_PAD4, and a fourth enable output pad EO_PAD4.

The memory controller 110 and the plurality of nonvolatile memories NVM1 to NVM4 may be connected with each other through the plurality of data lines DQ. For convenience, the description may be given as the plurality of data lines DQ are divided into the plurality of internal data lines DQ_in_12, DQ_in_23, DQ_in_34 and the plurality of external data lines DQ_ext.

Input/output pads of the memory controller 110 and the first input/output pads IOPAD1 of the first nonvolatile memory NVM1 may be connected through the plurality of external data lines DQ_ext. The first input/output pads IOPAD1 of the first nonvolatile memory NVM1 and the second input/output pads IOPAD2 of the second nonvolatile memory NVM2 may be connected through the plurality of internal data lines DQ_in_12. The second input/output pads IOPAD2 of the second nonvolatile memory NVM2 and the third input/output pads IOPAD3 of the third nonvolatile memory NVM3 may be connected through the plurality of internal data lines DQ_in_23. The third input/output pads IOPAD3 of the third nonvolatile memory NVM3 and the fourth input/output pads IOPAD4 of the fourth nonvolatile memory NVM4 may be connected through the plurality of internal data lines DQ_in_34.

In an embodiment, enable output pads EO_PAD1 to EO_PAD3 may be respectively connected with enable input pads EI_PAD2 to EI_PAD4 of adjacent nonvolatile memories, respectively. A second initialization enable signal $CIE_12$ output from the first enable output pad EO_PAD1 may be input to the second enable input pad EI_PAD2, a third initialization enable signal $CIE_23$ output from the second enable output pad EO_PAD2 may be input to the third enable input pad EI_PAD3, and a fourth initialization enable signal $CIE_34$ output from the third enable output pad EO_PAD3 may be input to the fourth enable input pad EI_PAD4. That is, the plurality of nonvolatile memories NVM1 to NVM4 may be connected in a daisy chain structure through the enable input pads EI_PAD1 to EI_PAD4 and the enable output pads EO_PAD1 to EO_PAD4.

An enable input pad EI_PAD of one of the nonvolatile memories NVM1 to NVM4 of the nonvolatile memory device 120, that is, a start nonvolatile memory need not be connected with an enable output pad EO_PAD of any other nonvolatile memory. In an embodiment, the start nonvolatile memory may indicate a nonvolatile memory including the first input/output pads IOPAD1 connected with the memory controller 110 through the external data lines DQ_ext. The start nonvolatile memory may indicate the first nonvolatile memory NVM1. The first enable input pad EI_PAD1 of the first nonvolatile memory NVM1 need not be connected with the enable output pad EO_PAD of any other nonvolatile memory and may be connected with a power supply voltage (e.g., VDD).

An enable output pad EO_PAD of one of the nonvolatile memories NVM1 to NVM4 of the nonvolatile memory device 120, that is, the last nonvolatile memory need not be connected with an enable input pad EI_PAD of any other nonvolatile memory. For example, the fourth enable output pad EO_PAD4 need not be connected with a pad of any other nonvolatile memory. That is, the fourth enable output pad EO_PAD4 may be floated.

In an embodiment, the enable output pad EO_PAD of the last nonvolatile memory may be connected with the memory controller 110 through the initialization complete signal. For example, the fourth enable output pad EO_PAD4 and a pad of the memory controller 110 may be connected through the initialization complete signal.

The memory controller 110 may receive the initialization complete signal from the fourth enable output pad EO_PAD4. When the initialization complete signal of the fourth nonvolatile memory NVM4 is at a logic high level, the memory controller 110 may recognize that the initialization operation of the nonvolatile memory device 120 is completed.

Figure 6:
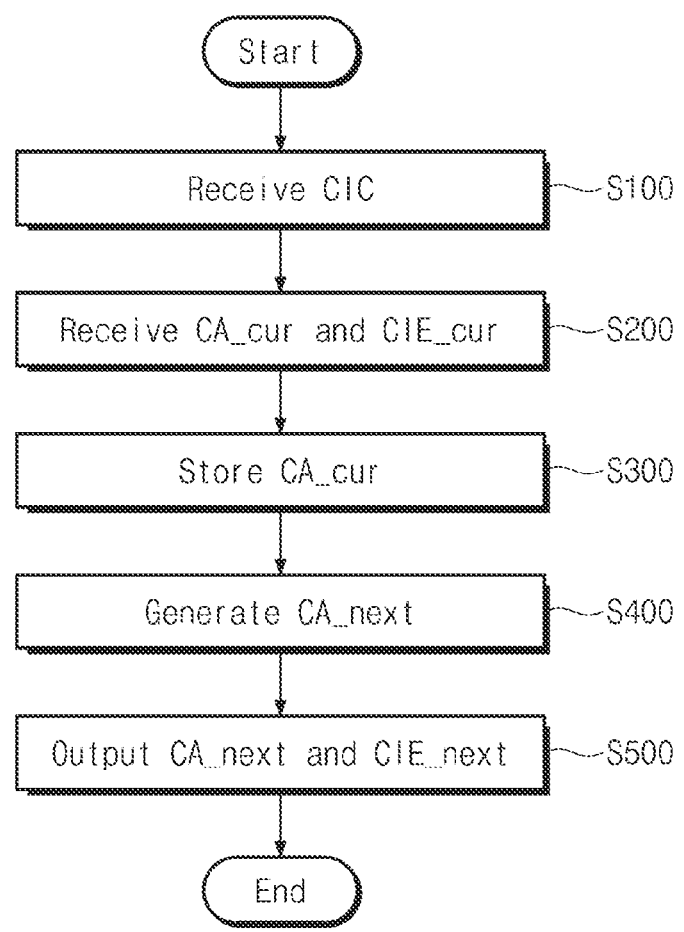
FIG. 6 is a flowchart illustrating an operation of a nonvolatile memory.

FIG. 6 illustrates an operation of a nonvolatile memory. Referring to FIGS. 1, 3, and 6, in operation S100, the chip address initialization circuit 123 of the nonvolatile memory NVM may receive a chip address initialization command CIC. In an embodiment, the chip address initialization circuit 123 may latch a signal received through the plurality of data lines DQ as the chip address initialization command CIC at a rising edge of the write enable signal WE/.

In operation S200, the chip address initialization circuit 123 may receive a current chip address CA_cur and a current initialization enable signal CIE_cur. For example, the chip address initialization circuit 123 may receive the current chip address CA_cur through the plurality of data lines DQ connected with the plurality of input/output pads IOPAD and may receive the current initialization enable signal CIE_cur through the enable input pad EI_PAD.

In an embodiment, the current chip address CA_cur may be a chip address corresponding to a current nonvolatile memory. For example, when the current nonvolatile memory is the second nonvolatile memory NVM2, the current chip address CA_cur may be a second chip address (e.g., "01") being a chip address of the second nonvolatile memory NVM2.

The current chip address CA_cur may be generated by the memory controller 110 or by a previous nonvolatile memory. For example, the chip address initialization circuit 123 of the first nonvolatile memory NVM1 may receive the current chip address CA_cur generated by the memory controller 110. The chip address initialization circuit 123 of the second nonvolatile memory NVM2 may receive the current chip address CA_cur generated by the first nonvolatile memory NVM1 being a previous nonvolatile memory.

In an embodiment, a previous nonvolatile memory may indicate a nonvolatile memory including the enable output pad EO_PAD connected with the enable input pad EI_PAD of a current nonvolatile memory. That is, when a current nonvolatile memory is the second nonvolatile memory NVM2, a previous nonvolatile memory may be the first nonvolatile memory NVM1 including the first enable output pad EO_PAD1 connected with the second enable input pad EI_PAD2

The chip address initialization circuit 123 may latch or store a signal received through the plurality of data lines DQ as the current chip address CA_cur at a rising edge of the write enable signal WE/or the current initialization enable signal CIE_cur. In an embodiment, a start nonvolatile memory (e.g., NVM1) may receive the current chip address CA_cur in synchronization with the write enable signal WE/. The remaining nonvolatile memories except the start nonvolatile memory may receive the current chip address CA_cur in synchronization with the current initialization enable signal CIE_cur. Each of the remaining nonvolatile memories (e.g., NVMx) except the start nonvolatile memory may indicate nonvolatile memories (e.g., NVM2 to NVM4) each including the input/output pads IOPAD connected with any other nonvolatile memory (e.g., NVMy) through a plurality of internal data lines (e.g., DQ_in_xy).

In operation S300, the chip address initialization circuit 123 may store the current chip address CA_cur. In an embodiment, in the case of the first nonvolatile memory NVM1, the chip address initialization circuit 123 may store a first chip address CA1 being the start chip address in synchronization with the rising edge of the write enable signal WE/. The remaining nonvolatile memories NVM2 to NVM4 may receive the current chip address CA_cur in synchronization with the rising edge of the current initialization enable signal CIE_cur.

In an embodiment, after the initialization operation is completed, in a general write or read operation, a nonvolatile memory may compare a chip address received during a chip select period and the current chip address CA_cur stored therein to determine whether to receive a command, an address, or data through the plurality of data lines DQ. That is, when the current chip address CA_cur and the received chip address are identical, it may be possible to receive a command, an address, or data through the plurality of data lines DQ.

In operation S400, the chip address initialization circuit 123 may generate a next chip address CA_next. In an embodiment, the next chip address CA_next may be a chip address corresponding to a next nonvolatile memory. A next nonvolatile memory may indicate a nonvolatile memory including the enable input pad EI_PAD connected with the enable output pad EO_PAD of a current nonvolatile memory. For example, when a current nonvolatile memory is the second nonvolatile memory NVM2, a next nonvolatile memory may be the third nonvolatile memory NVM3 including the third enable input pad EI_PAD3 connected with the second enable output pad EO_PAD2.

The chip address initialization circuit 123 may add the current chip address CA_cur and a given value to generate the next chip address CA_next. The given value may be one, without limitation thereto. For example, when a current nonvolatile memory is the second nonvolatile memory NVM2, the second nonvolatile memory NVM2 may add a second chip address CA2 (e.g., "01") being the current chip address CA_cur and "1" to generate a third chip address CA3 (e.g., "10") being the next chip address CA_next.

In operation S500, the chip address initialization circuit 123 may output the next chip address CA_next and a next initialization enable signal CIE_next. The chip address initialization circuit 123 may transmit the next chip address CA_next to a next nonvolatile memory through the plurality of data lines DQ. The chip address initialization circuit 123 may transmit the next initialization enable signal CIE_next to the next nonvolatile memory through the enable output pad EO_PAD.

The chip address initialization circuit 123 may transmit the next the next chip address CA_next to the next nonvolatile memory in synchronization with the next initialization enable signal CIE_next. That is, the next chip address CA_next and the next initialization enable signal CIE_next may be transmitted such that a rising edge of the next initialization enable signal CIE_next is center-aligned with a window of a data signal.

Figure 7:
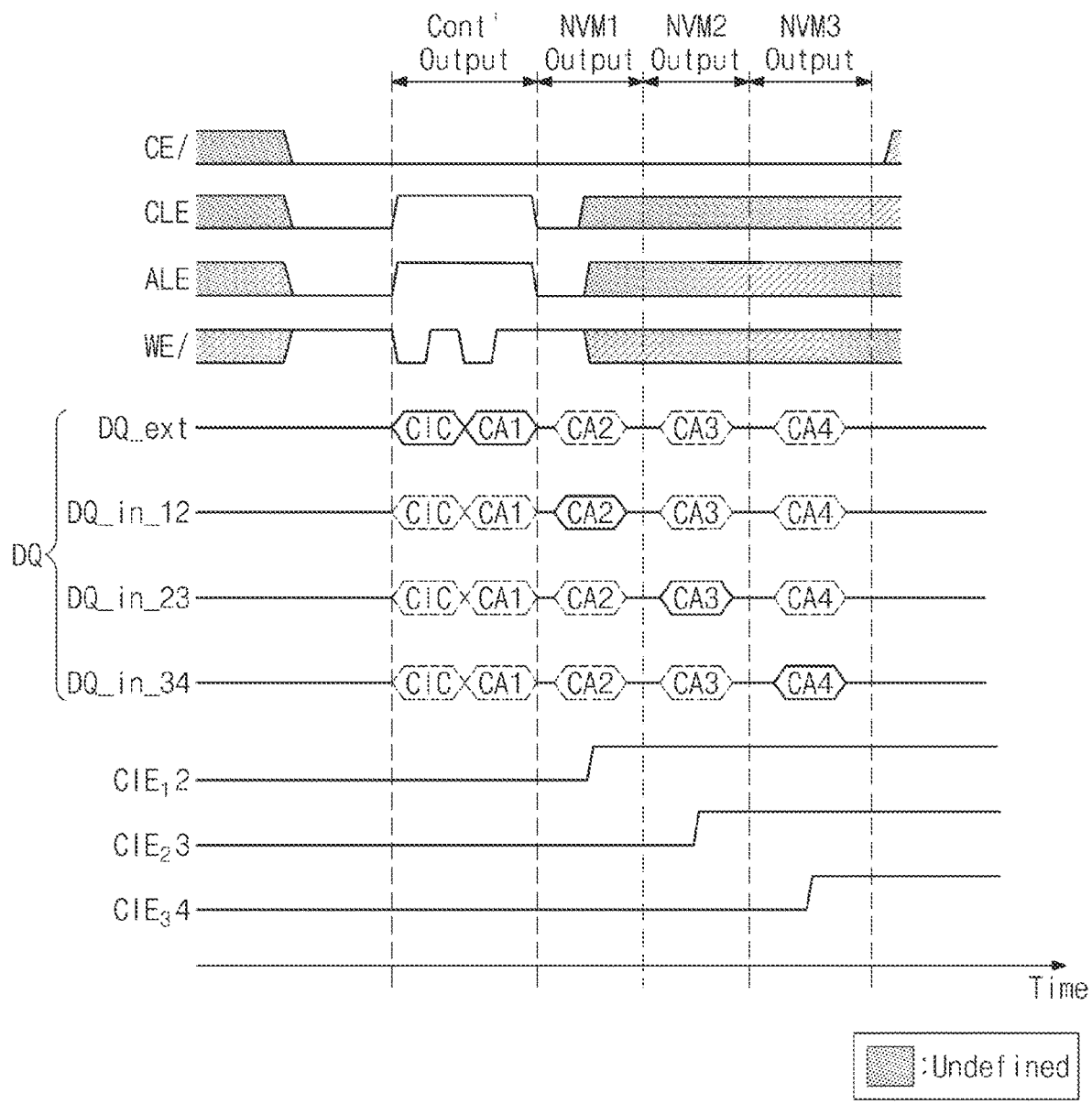
FIG. 7 is a timing diagram illustrating an operation of a nonvolatile memory device.

FIG. 7 illustrates an operation of a nonvolatile memory device. Referring to FIGS. 1 and 7, the plurality of data lines DQ may be divided into the plurality of internal data lines DQ_in_12, DQ_in_23, DQ_in_34 and the plurality of external data lines DQ_ext. This is described with reference to FIG. 4, and thus, additional description may be omitted to avoid redundancy.

The memory controller 110 may transmit the chip address initialization command CIC and the first chip address CA1 being the start chip address during a controller output period Cont' Output. In an embodiment, the chip address initialization command CIC may be a command (e.g., E2h) for allocating or initializing chip addresses of a plurality of nonvolatile memories. The first chip address CA1 may be a chip address (e.g., "00") that the memory controller 110 generates and corresponds to one of the plurality of nonvolatile memories, such as NVM1.

In an embodiment, during the controller output period Cont' Output, a command latch enable signal CLE and an address latch enable signal ALE may be at a logic high level, and the chip enable signal CE/may be at a logic low level. During the controller output period Cont' Output, the nonvolatile memory device 120 may latch a signal received through the plurality of external data lines DQ_ext as the chip address initialization command CIC and the first chip address CA1 at rising edges of the write enable signal WE/. The above signal levels are exemplary, and the present disclosure is not limited thereto.

The first nonvolatile memory NVM1 may store the first chip address CA1 thus received. The first nonvolatile memory NVM1 may generate a second chip address CA2 by using the first chip address CA1. For example, the first nonvolatile memory NVM1 may add the first chip address CA1 and a given value to generate the second chip address CA2. That is, the first nonvolatile memory NVM1 may add "00" being the first chip address CA1 and "1" to generate the second chip address CA2 (e.g., "01").

During a first nonvolatile memory output period NVM1 Output, the first nonvolatile memory NVM1 may transmit the second chip address CA2 to the second nonvolatile memory NVM2 through the plurality of internal data lines DQ_in_12 in synchronization with a rising edge of the second initialization enable signal $CIE_12$.

The second nonvolatile memory NVM2 may latch a signal received through the plurality of internal data lines DQ_in_12 as the second chip address CA2 at the rising edge of the second initialization enable signal $CIE_12$. The second nonvolatile memory NVM2 may store the second chip address CA2 thus received. The second nonvolatile memory NVM2 may generate the third chip address CA3 by using the second chip address CA2. That is, the second nonvolatile memory NVM2 may add the second chip address CA2 (e.g., "01") and "1" to generate the third chip address CA3 (e.g., "10").

During a second nonvolatile memory output period NVM2 Output, the second nonvolatile memory NVM2 may transmit the third chip address CA3 to the third nonvolatile memory NVM3 through the plurality of internal data lines DQ_in_23 in synchronization with a rising edge of the third initialization enable signal $CIE_23$.

The third nonvolatile memory NVM3 may latch a signal received through the plurality of internal data lines DQ_in_23 as the third chip address CA3 at the rising edge of the third initialization enable signal $CIE_23$. The third nonvolatile memory NVM3 may store the third chip address CA3 thus received. The third nonvolatile memory NVM3 may generate the fourth chip address CA4 by using the third chip address CA3. That is, the third nonvolatile memory NVM3 may add the third chip address CA3 (e.g., "10") and "1" to generate the fourth chip address CA4 (e.g., "11").

During a third nonvolatile memory output period NVM3 Output, the third nonvolatile memory NVM3 may transmit the fourth chip address CA4 to the fourth nonvolatile memory NVM4 through the plurality of internal data lines DQ_in_34 in synchronization with a rising edge of the fourth initialization enable signal $CIE_34$.

The fourth nonvolatile memory NVM4 may latch a signal received through the plurality of internal data lines DQ_in_34 as the fourth chip address CA4 at the rising edge of the fourth initialization enable signal $CIE_34$. The fourth nonvolatile memory NVM4 may store the fourth chip address CA4 thus received.

In an embodiment, because it may be assumed that the nonvolatile memory device 120 includes the first to fourth nonvolatile memories NVM1 to NVM4, the fourth enable output pad EO_PAD4 of the fourth nonvolatile memory NVM4 need not be connected with the enable input pad EI_PAD of any other nonvolatile memory.

However, the fourth nonvolatile memory NVM4 may generate a next chip address and a next initialization enable signal. The fourth nonvolatile memory NVM4 may generate the next chip address by using the fourth chip address CA4. The fourth nonvolatile memory NVM4 may output the next chip address through the plurality of data lines DQ_in synchronization with a rising edge of the next initialization enable signal. The fourth nonvolatile memory NVM4 may output the next initialization enable signal through the fourth enable output pad EO_PAD4.

In an embodiment, the fourth enable output pad EO_PAD4 and the memory controller 110 may be connected. The memory controller 110 may receive an initialization complete signal output from the fourth enable output pad EO_PAD4. That is, the next initialization enable signal of the fourth nonvolatile memory NVM4 need not be transmitted to any other nonvolatile memory. Instead, the next initialization enable signal of the fourth nonvolatile memory NVM4 may be transmitted to the memory controller 110 as the initialization complete signal.

Figure 8:
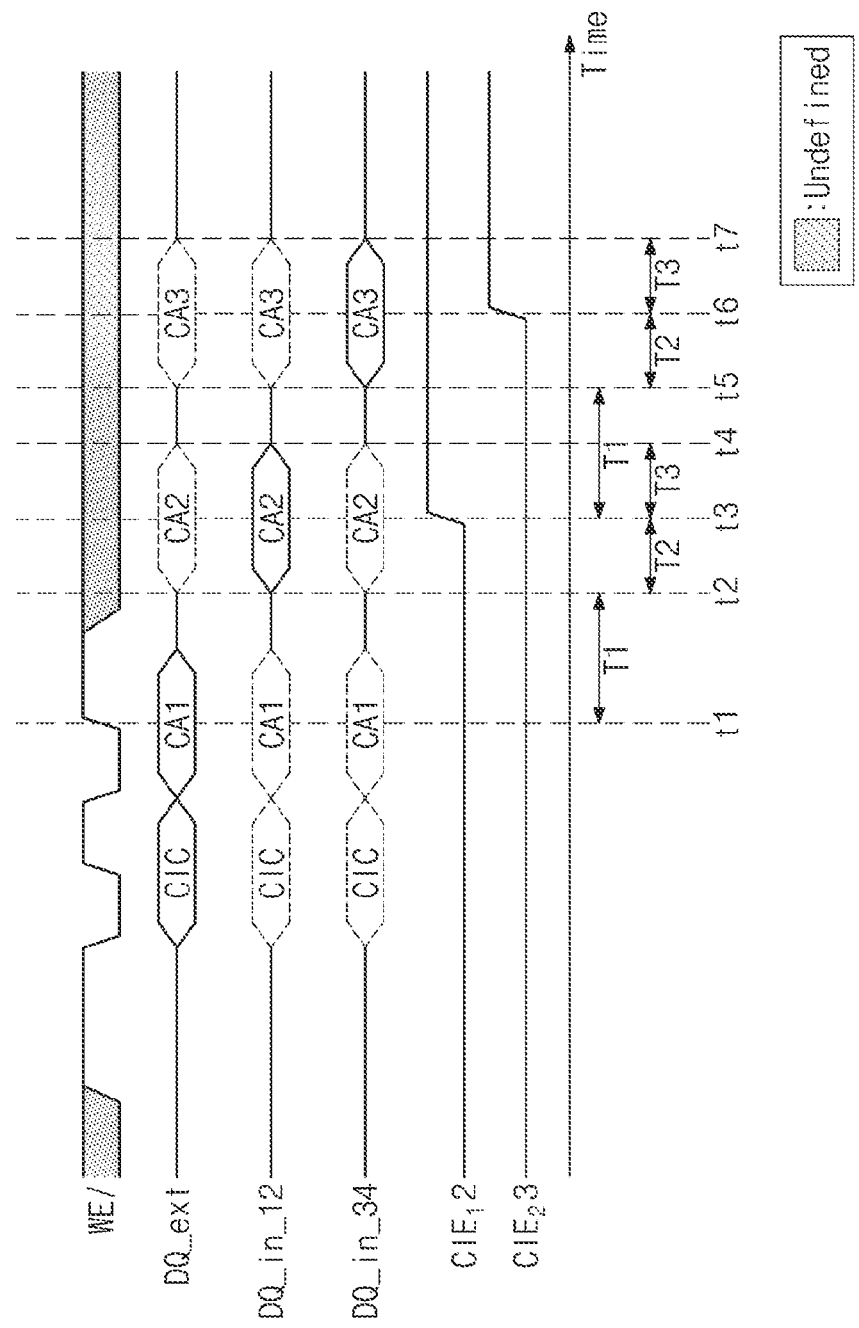
FIG. 8 is a timing diagram illustrating an operation of a nonvolatile memory device.

FIG. 8 illustrates an operation of a nonvolatile memory device. Referring to FIGS. 1, 7, and 8, each of nonvolatile memories may generate an initialization enable signal such that a rising edge of the initialization enable signal is aligned with the center of the window of the plurality of data lines DQ (e.g., is center-aligned with the window). In alternate embodiments, a falling edge may be used instead. In alternate embodiments, the rising or falling edge need not be center-aligned, but may be aligned with an earlier or later portion of the window.

For example, the first nonvolatile memory NVM1 may output the second chip address CA2 through the plurality of internal data lines DQ_in_12 after a first time period T1 elapses from a first time t1, that is, from a second time t2. In greater detail, the first time t1 may be a time when the first chip address CA1 is latched based on a result of detecting the rising edge of the write enable signal WE/. The first nonvolatile memory NVM1 may set the second initialization enable signal $CIE_12$ to a logic high level after a second time period T2 elapses from the second time t2, that is, at a third time t3. The first nonvolatile memory NVM1 need not output the second chip address CA2 through the plurality of internal data lines DQ_in_12 after a third time period T3 elapses from the third time t3, that is, from a fourth time t4.

As such, the first nonvolatile memory NVM1 may align a rising edge by outputting the second chip address CA2 from the second time t2 to the fourth time t4 and setting the second initialization enable signal $CIE_12$ to a logic high level at the third time t3.

The second nonvolatile memory NVM2 may output the third chip address CA3 through the plurality of internal data lines DQ_in_23 after the first time period T1 elapses from the third time t3, that is, from a fifth time t5. In greater detail, the third time t3 may be a time when the second chip address CA2 is latched based on a result of detecting the rising edge of the second initialization enable signal $CIE_12$. The second nonvolatile memory NVM2 may set the third initialization enable signal $CIE_23$ to a logic high level after the second time period T2 elapses from the fifth time t5, that is, at a sixth time t6. The second nonvolatile memory NVM2 need not output the third chip address CA3 through the plurality of internal data lines DQ_in_23 after the third time period T3 elapses from the sixth time t6, that is, from a seventh time t7.

As such, the second nonvolatile memory NVM2 may align a rising edge by outputting the third chip address CA3 from the fifth time t5 to the seventh time t7 and setting the third initialization enable signal $CIE_23$ to a logic high level at the sixth time t6. Operations of the third and fourth nonvolatile memories NVM3 and NVM4 are similar to the operation of the second nonvolatile memory NVM2, and thus, additional description may be omitted to avoid redundancy.

As described above, a next chip address may start to be output from a time when the first time period T1 elapses after a time when a current chip address is received. The first nonvolatile memory NVM1 and the remaining nonvolatile memories NVM2 to NVM4 may have different timing when a current chip address is received. Because the first nonvolatile memory NVM1 receives the first chip address CA1 from the memory controller 110 in synchronization with the write enable signal WE/, a time when the rising edge of the write enable signal WE/is detected may correspond to a time when a current chip address is received. In contrast, because each of the remaining nonvolatile memories NVM2 to NVM4 receives a current chip address in synchronization with the initialization enable signal CIE from a previous nonvolatile memory, a time when the rising edge of the initialization enable signal CIE is detected may correspond to a time when a current chip address is received.

Figure 9:
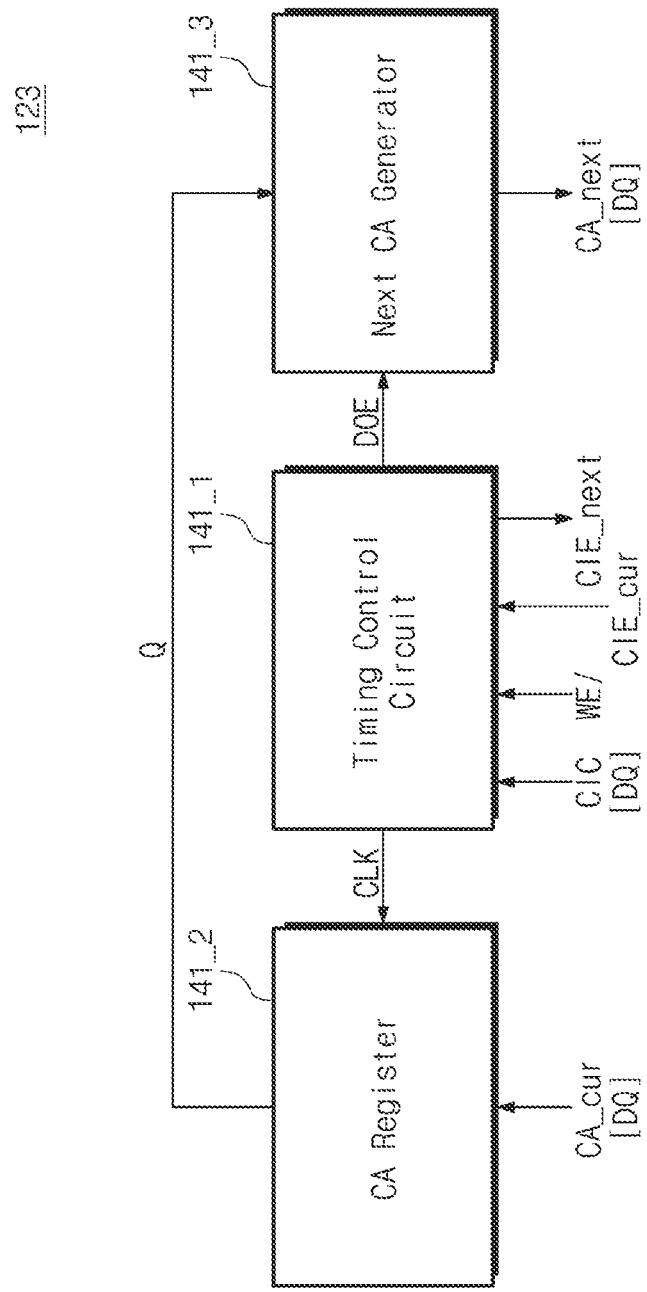
FIG. 9 is a block diagram illustrating a chip address initialization circuit.

FIG. 9 illustrates a chip address initialization circuit. Referring to FIGS. 1, 5, and 9, the chip address initialization circuit 123 may include a timing control circuit 141_1, a chip address register 141_2, and a next chip address generator 141_3.

The chip address initialization circuit 123 may receive the current initialization enable signal CIE_cur and the write enable signal WE/. The current initialization enable signal CIE_cur may be received through the enable input pad EI_PAD. The chip address initialization circuit 123 may transmit the next initialization enable signal CIE_next. The next initialization enable signal CIE_next may be output through the enable output pad EO_PAD.

The chip address initialization circuit 123 may receive the chip address initialization command CIC and the current chip address CA_cur through the plurality of data lines DQ and may transmit the next chip address CA_next through the plurality of data lines DQ. The chip address initialization command CIC, the current chip address CA_cur, and the next chip address CA_next received through the plurality of data lines DQ may be exchanged through the input/output pads IOPAD.

For example, when a current nonvolatile memory is the second nonvolatile memory NVM2, the current initialization enable signal CIE_cur may be received through the second enable input pad EI_PAD2. The next initialization enable signal CIE_next may be output through the second enable output pad EO_PAD2. The chip address initialization command CIC, the current chip address CA_cur, and the next chip address CA_next may be exchanged through the second input/output pads IOPAD2.

The timing control circuit 141_1 may receive the write enable signal WE/ and the current initialization enable signal CIE_cur. The timing control circuit 141_1 may receive the chip address initialization command CIC through the plurality of data lines DQ. The timing control circuit 141_1 may generate a clock signal CLK, a data output enable signal DOE, and the next initialization enable signal CIE_next based on the write enable signal WE/ or the current initialization enable signal CIE_cur.

In an embodiment, the timing control circuit 141_1 may control timing to latch the current chip address CA_cur through the clock signal CLK, may control timing to output the next chip address CA_next through the data output enable signal DOE, and may control timing to generate the next initialization enable signal CIE_next.

The timing control circuit 141_1 may transmit the clock signal CLK to the chip address (CA) register 141_2. The timing control circuit 141_1 may transmit the data output enable signal DOE to the next CA generator 141_3. The timing control circuit 141_1 may transmit the next initialization enable signal CIE_next to a next nonvolatile memory.

The chip address register 141_2 may receive the current chip address CA_cur through the plurality of data lines DQ. The chip address register 141_2 may receive the clock signal CLK from the timing control circuit 141_1. The chip address register 141_2 may latch or store the current chip address CA_cur based on the clock signal CLK thus received. The chip address register 141_2 may transmit the current chip address CA_cur stored therein to the next chip address generator 141_3.

The next chip address generator 141_3 may receive the data output enable signal DOE from the timing control circuit 141_1. The next chip address generator 141_3 may receive the current chip address CA_cur from the chip address register 141_2. The next chip address generator 141_3 may generate the next chip address CA_next by using the current chip address CA_cur. The next chip address generator 141_3 may transmit the next chip address CA_next through the plurality of data lines DQ in response to the data output enable signal DOE received from the timing control circuit 141_1.

Figure 10:
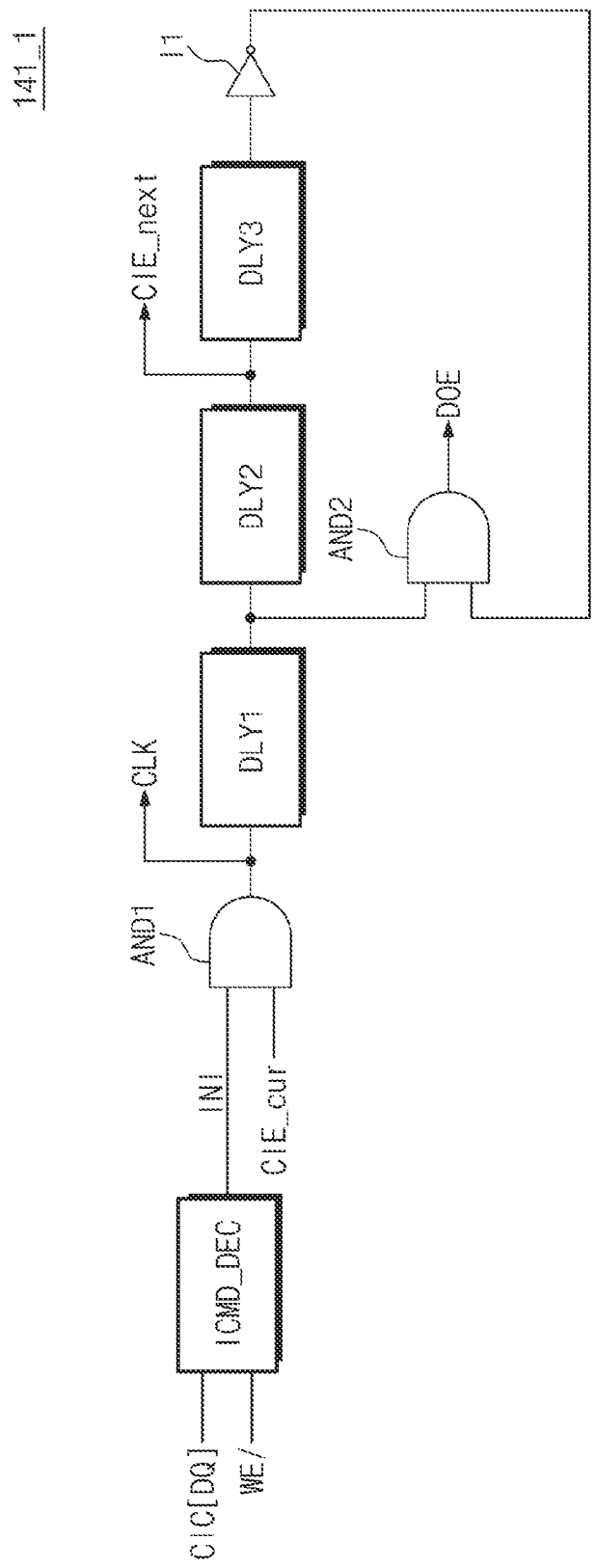
FIG. 10 is a block diagram illustrating a timing control circuit of FIG. 9.

FIG. 10 illustrates a timing control circuit of FIG. 9 in greater detail. Referring to FIGS. 9 and 10, the timing control circuit 141_1 may control timing to latch the current chip address CA_cur, may control timing to output the next chip address CA_next, and may control timing to generate the next initialization enable signal CIE_next.

The timing control circuit 141_1 may include an initialization command decoder ICMD_DEC, first to third delay circuits DLY1 to DLY3, a first inverter I1, and first and second AND gates AND1 and AND2. The initialization command decoder ICMD_DEC may receive the write enable signal WE/ and may receive the chip address initialization command CIC through the plurality of data lines DQ. The initialization command decoder ICMD_DEC may output an initialization signal INI.

In an embodiment, before the chip address initialization command CIC is received, an initial state of the initialization signal INI may be at a logic low level. The initialization command decoder ICMD_DEC may latch a signal received through the plurality of data lines DQ as the chip address initialization command CIC at a rising edge of the write enable signal WE/. When the chip address initialization command CIC is received, the initialization command decoder ICMD_DEC may output the initialization signal INI of a logic high level. The initialization signal INI may be provided to the first AND gate AND1.

The first AND gate AND1 may receive the initialization signal INI and the current initialization enable signal CIE_cur. The first AND gate AND1 may output the clock signal CLK. In an embodiment, when the initial state of the initialization signal INI is at a logic high level, an initial state of the clock signal CLK may be at a logic low level.

When both the initialization signal INI and the current initialization enable signal CIE_cur are at a logic high level, the first AND gate AND1 may output the clock signal CLK of a logic high level. That is, when the chip address initialization command CIC is received through the plurality of data lines DQ and the current initialization enable signal CIE_cur is at a logic high level, the clock signal CLK may transition from a logic low level to a logic high level.

In an embodiment, when a current nonvolatile memory is the first nonvolatile memory NVM1, the clock signal CLK may transition from a logic low level to a logic high level at the first time t1. That is, the clock signal CLK may be generated based on the write enable signal WE/. Alternatively, when a current nonvolatile memory is the second nonvolatile memory NVM2, the clock signal CLK may transition from a logic low level to a logic high level at the third time t3. That is, the clock signal CLK may be generated based on the current initialization enable signal CIE_cur. The clock signal CLK may be provided to the first delay circuit DLY1.

The first delay circuit DLY1 may receive the clock signal CLK. The first delay circuit DLY1 may delay the received signal as much as the first time period T1. A signal output from the first delay circuit DLY1 may be provided to the second delay circuit DLY2 and the second AND gate AND2.

The second AND gate AND2 may receive the signal output from the first delay circuit DLY1 and a signal output from the first inverter I1. The second AND gate AND2 may output the data output enable signal DOE. Because the initial state of the clock signal CLK is at a logic low level, an initial state of the data output enable signal DOE may be at a logic low level.

Only when both the signal output from the first delay circuit DLY1 and the signal output from the first inverter I1 are at a logic high level, the second AND gate AND2 may output the data output enable signal DOE of a logic high level. That is, after the first time period T1 elapses from the low-to-high transition of the clock signal CLK, the data output enable signal DOE may transition from a logic low level to a logic high level. In other words, after the first time period T1 elapses from the third time t3, that is, at the fifth time t5, as the data output enable signal DOE transitions from a logic low level to a logic high level, the second nonvolatile memory NVM2 may output the third chip address CA3 through the plurality of data lines DQ.

The second delay circuit DLY2 may receive the signal output from the first delay circuit DLY1. The second delay circuit DLY2 may output the next initialization enable signal CIE_next. Because the initial state of the clock signal CLK is at a logic low level, an initial state of the next initialization enable signal CIE_next may be at a logic low level. The second delay circuit DLY2 may output a signal, which is obtained by delaying the signal output from the first delay circuit DLY1 as much as the second time period T2, as the next initialization enable signal CIE_next. That is, after the second time period T2 elapses from the low-to-high transition of the data output enable signal DOE, the next initialization enable signal CIE_next may transition from a logic low level to a logic high level. In other words, after the second time period T2 elapses from the fifth time t5, that is, at the sixth time t6, the next initialization enable signal CIE_next may transition from a logic low level to a logic high level.

The third delay circuit DLY3 may receive the next initialization enable signal CIE_next. The third delay circuit DLY3 may output a signal that is obtained by delaying the received next initialization enable signal CIE_next as much as the third time period T3. Because an initial state of the next initialization enable signal CIE_next is at a logic low level, an initial state of the signal output from the third delay circuit DLY3 may be at a logic low level. After the third time period T3 elapses from the low-to-high transition of the next initialization enable signal CIE_next, the signal output from the third delay circuit DLY3 may transition from a logic low level to a logic high level. In other words, after the third time period T3 elapses from the sixth time t6, that is, at the seventh time t7, the signal output from the third delay circuit DLY3 may transition from a logic low level to a logic high level. The signal output from the third delay circuit DLY3 may be provided to the first inverter I1.

The first inverter I1 may receive the signal output from the third delay circuit DLY3. The first inverter I1 may invert and output the received signal. Because the initial state of the signal output from the third delay circuit DLY3 is at a logic low level, an initial state of a signal output from the first inverter I1 may be at a logic high level. After the third time period T3 elapses from the low-to-high transition of the next initialization enable signal CIE_next, the signal output from the first inverter I1 may transition from a logic high level to a logic low level. In other words, after the third time period T3 elapses from the sixth time t6, that is, at the seventh time t7, the signal output from the first inverter I1 may transition from a logic high level to a logic low level. The signal output from the first inverter I1 may be provided to the second AND gate AND2.

As described above, the second AND gate AND2 may receive the signal output from the first delay circuit DLY1 and the signal output from the first inverter I1. The initial state of the data output enable signal DOE may be at a logic low level, and the data output enable signal DOE may transition from a logic low level to a logic high level at the fifth time t5. Afterwards, because the signal output from the first inverter I1 transitions from a logic high level to a logic low level at the seventh time t7, the data output enable signal DOE may transition from a logic high level to a logic low level at the seventh time t7. In other words, the second nonvolatile memory NVM2 need not output the third chip address CA3 through the plurality of data lines DQ from the seventh time t7.

Figure 11:
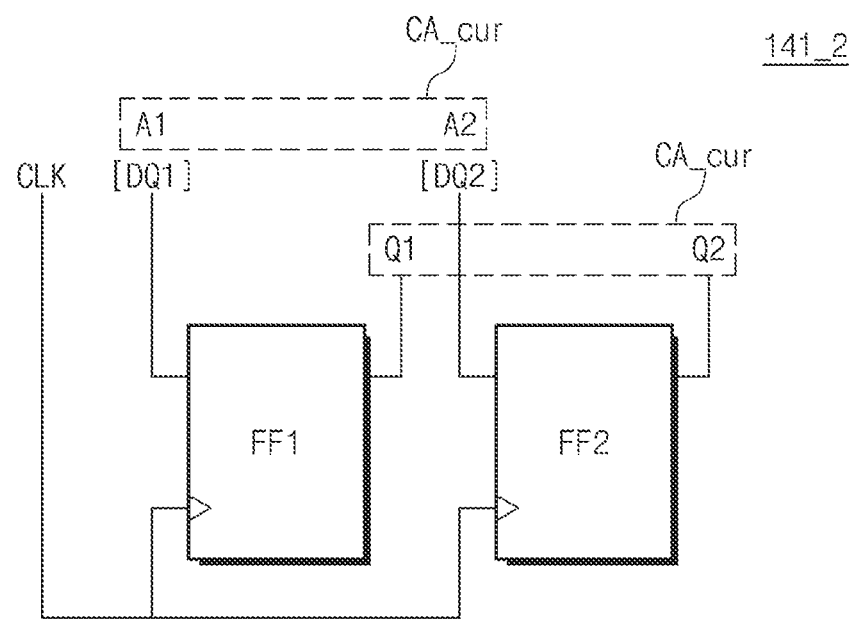
FIG. 11 is a block diagram illustrating a chip address register of FIG. 9 in greater detail.

FIG. 11 illustrates a chip address register of FIG. 9 in greater detail. The chip address register 141_2 illustrated in FIG. 11 is exemplary, and the present disclosure is not limited thereto. Below, for a brief description, it may be assumed that the chip address register 141_2 includes a first flip-flop FF1 and a second flip-flop FF2.

Because the nonvolatile memory device 120 includes the first to fourth nonvolatile memories NVM1 to NVM4, a chip address CA of at least two bits may be used to recognize the first to fourth nonvolatile memories NVM1 to NVM4 independently of each other. Accordingly, the description may be given as the chip address register 141_2 includes at least two flip-flops. However, the present disclosure is not limited thereto. For example, as the number of nonvolatile memories in the nonvolatile memory device 120 increases, the number of flip-flops in the chip address register 141_2 may also increase.

The chip address register 141_2 may receive the clock signal CLK from the timing control circuit 141_1 and may receive the current chip address CA_cur through the plurality of data lines DQ. It may be assumed that the plurality of data lines DQ transfer first to eighth data signals DQ1 to DQ8. It may be assumed that because a chip address is a 2-bit address, the chip address is transmitted/received through the first and second data signals DQ1 and DQ2 of the first to eighth data signals DQ1 to DQ8. However, the present disclosure is not limited thereto. For example, a chip address may be transmitted/received through any two signals of the first to eighth data signals DQ1 to DQ8.

The current chip address CA_cur may include a first address bit A1 and a second address bit A2. The first address bit A1 may be transmitted through the first data signal DQ1. The second address bit A2 may be transmitted through the second data signal DQ2.

The first flip-flop FF1 may store the first address bit A1 through the first data signal DQ1 in response to the clock signal CLK. That is, the first flip-flop FF1 may store a level of the first address bit A1 at a rising edge of the clock signal CLK. The level of the first address bit A1 stored in the first flip-flop FF1 may be provided to a first output Q1 of the first flip-flop FF1. For example, in the case of the second nonvolatile memory NVM2, the first output Q1 may be at a logic high level.

The second flip-flop FF2 may store the second address bit A2 through the second data signal DQ2 in response to the clock signal CLK. That is, the second flip-flop FF2 may store a level of the second address bit A2 at the rising edge of the clock signal CLK. The level of the second address bit A2 stored in the second flip-flop FF2 may be provided to a second output Q2 of the second flip-flop FF2. For example, in the case of the second nonvolatile memory NVM2, the second output Q2 may be at a logic low level.

A combination of the first and second outputs Q1 and Q2 may form the current chip address CA_cur of a current nonvolatile memory. For example, when a current nonvolatile memory is the second nonvolatile memory NVM2, because the first output Q1 is at a logic high level and the second output Q2 is a logic low level, "01" may be stored in the chip address register 141_2.

Figure 12:
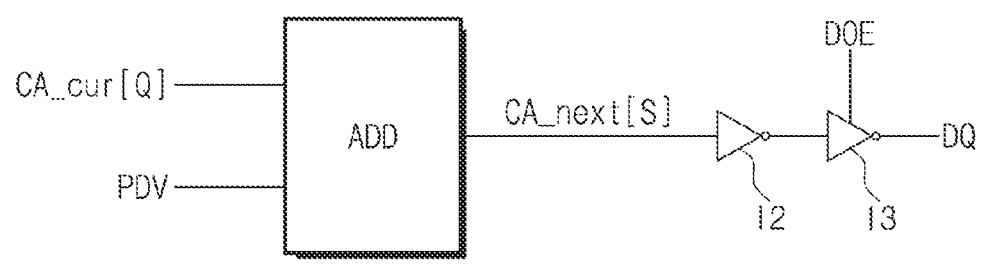
FIG. 12 is a block diagram illustrating a next chip address generator of FIG. 9 in greater detail.

FIG. 12 illustrates a next chip address generator of FIG. 9 in greater detail. The next chip address generator 141_3 illustrated in FIG. 12 is exemplary, and the present disclosure is not limited thereto. Referring to FIGS. 9 and 12, the next chip address generator 141_3 may include an adder ADD, a second inverter I2, and a third inverter I3. The next chip address generator 141_3 may receive the current chip address CA_cur from the chip address register 141_2 through an output Q. The next chip address generator 141_3 may receive the data output enable signal DOE from the timing control circuit 141_1. The next chip address generator 141_3 may transmit the next chip address CA_next thus generated to a next nonvolatile memory through the plurality of data lines DQ.

The adder ADD may receive the current chip address CA_cur from the chip address register 141_2 through the output Q and may receive a given value or predetermined value PDV. The given value PDV may indicate a difference between the current chip address CA_cur and the next chip address CA_next. In an embodiment, the given value PDV may be "1", without limitation thereto. The adder ADD may add the current chip address CA_cur and the given value PDV to generate the next chip address CA_next. The adder ADD may transmit the next chip address CA_next to the second inverter I2 through a sum signal "S".

The second inverter I2 may invert and output the next chip address CA_next received through the sum signal "S". A signal output from the second inverter I2 may be provided to the third inverter I3. The third inverter I3 may receive the signal output from the second inverter I2 and may receive the data output enable signal DOE output from the timing control circuit 141_1. The third inverter I3 may invert the signal received from the second inverter I2 in synchronization with the data output enable signal DOE and may output the inverted signal through the plurality of data lines DQ. That is during a period where the data output enable signal DOE is at a logic high level, the third inverter I3 may output the next chip address CA_next through a plurality of data lines DQ. For example, because the data output enable signal DOE of the second nonvolatile memory NVM2 is at a logic high level from the fifth time t5 to the seventh time t7, the second nonvolatile memory NVM2 may output the third chip address CA3 through the plurality of internal data lines DQ_in_23 from the fifth time t5 to the seventh time t7.

Figure 13:
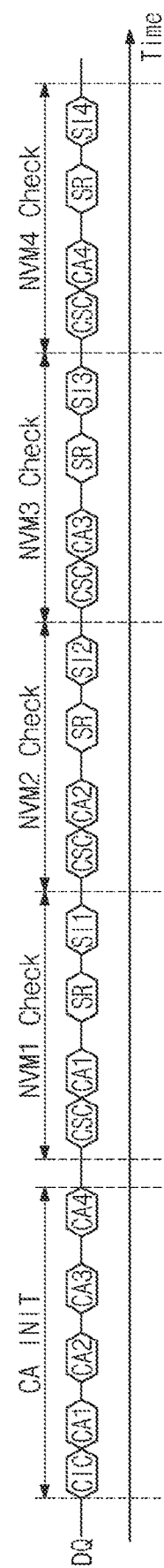
FIG. 13 is a timing diagram illustrating an operation of a nonvolatile memory device.

FIG. 13 illustrates an operation of a nonvolatile memory device. For brevity of drawing and convenience of description, only the plurality of data lines DQ are illustrated, and other signals (e.g., CE/, CLE, ALE, WE/, and RE/) may be omitted. Referring to FIGS. 1 and 13, the memory controller 110 may allocate or initialize chip addresses of a plurality of nonvolatile memories during a chip address initialization period CA INIT. This is described above, and thus, additional description may be omitted to avoid redundancy.

The memory controller 110 may determine whether a chip address is correctly initialized. In an embodiment, the memory controller 110 may transmit a chip select command CSC, the first chip address CA1, and a status read command SR through the plurality of data lines DQ during a first nonvolatile memory check period NVM1 Check. For example, the status read command SR may be a command (e.g., 70*h*) for checking a status of a nonvolatile memory. Afterwards, the first nonvolatile memory NVM1 may output first status information SI1 through the plurality of data lines DQ_in response to the status read command SR.

Figure 14:
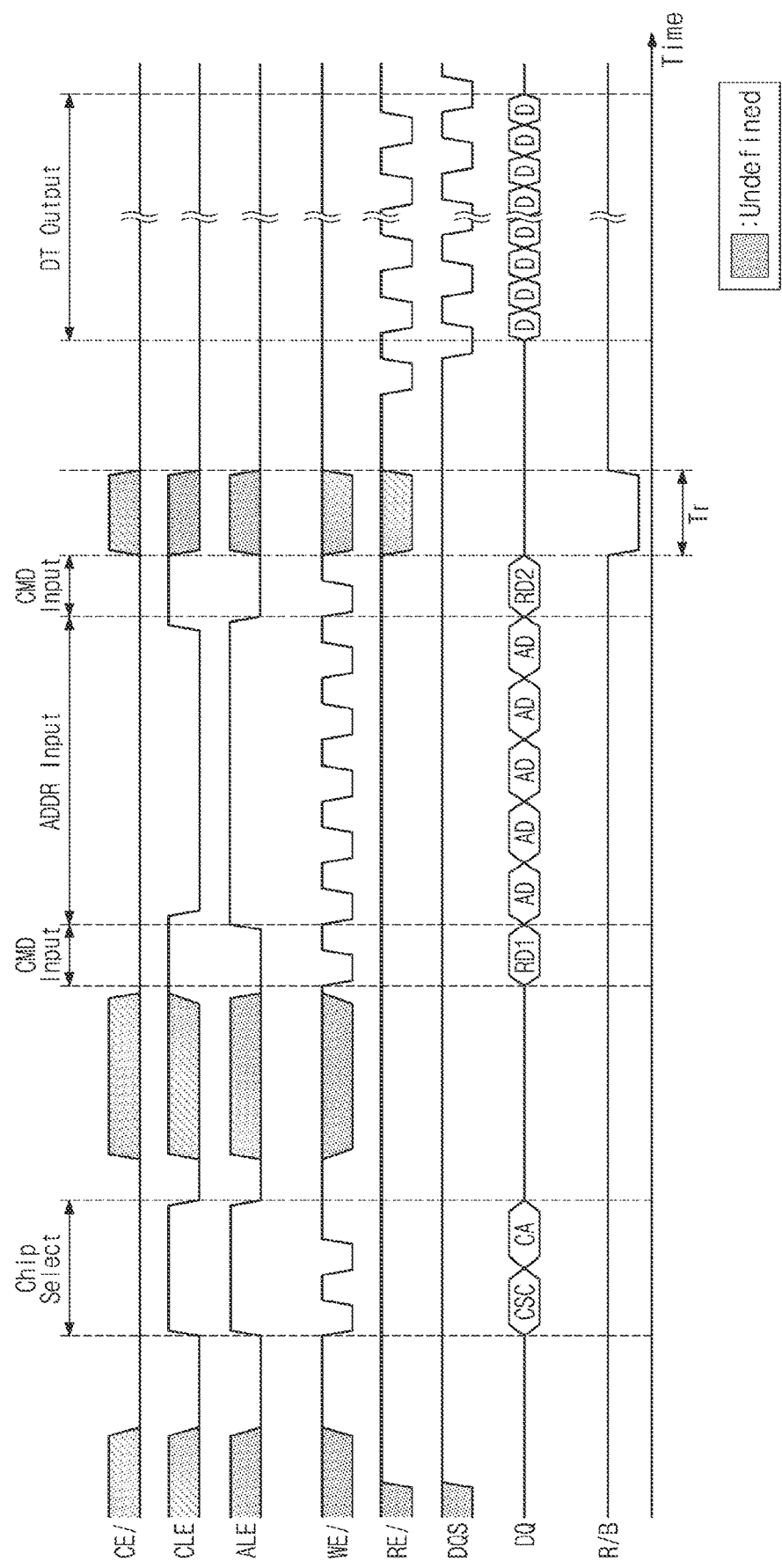
FIG. 14 is a timing diagram illustrating an operation of a nonvolatile memory device.

Referring briefly to FIGS. 1, 13 and 14, the chip select command CSC and the first chip address CA1 may be transmitted during a chip select period Chip Select of FIG. 14. The status read command SR may be transmitted during a command input period CMD Input of FIG. 14. The first status information SI1 may be transmitted during a data output period DT Output of FIG. 14. This may be described in greater detail further below with reference to FIG. 14.

The memory controller 110 may transmit the chip select command CSC, the second chip address CA2, and the status read command SR through the plurality of data lines DQ during a second nonvolatile memory check period NVM2 Check. Afterwards, the second nonvolatile memory NVM2 may output second status information SI2 through the plurality of data lines DQ_in response to the status read command SR.

The memory controller 110 may transmit the chip select command CSC, the third chip address CA3, and the status read command SR through the plurality of data lines DQ during a third nonvolatile memory check period NVM3 Check. Afterwards, the third nonvolatile memory NVM3 may output third status information SI3 through the plurality of data lines DQ in response to the status read command SR.

The memory controller 110 may transmit the chip select command CSC, the fourth chip address CA4, and the status read command SR through the plurality of data lines DQ during a fourth nonvolatile memory check period NVM4 Check. Afterwards, the fourth nonvolatile memory NVM4 may output fourth status information SI4 through the plurality of data lines DQ in response to the status read command SR.

As described above, after the chip address initialization operation is completed, the memory controller 110 may check whether a chip address is correctly set, through the status read command SR. The memory controller 110 may select a nonvolatile memory, to which the status read command SR is to be transmitted, by transmitting the chip select command CSC and the chip address CA. Afterwards, the memory controller 110 may transmit the status read command SR. The memory controller 110 may receive the status information SI transmitted through the plurality of data lines DQ. The memory controller 110 may check whether a chip address of a nonvolatile memory is correctly initialized, based on the received status information SI.

FIG. 14 illustrates an operation of a nonvolatile memory device. Referring to FIGS. 1 and 14, the nonvolatile memory device 120 may receive the chip select command CSC and the chip address CA through the data lines DQ during the chip select period Chip Select. In an embodiment, the chip select command CSC may be a command (e.g., E1*h*) for a chip select operation.

In an embodiment, during the chip select period Chip Select, the command latch enable signal CLE and the address latch enable signal ALE may be at a logic high level, and the chip enable signal CE/ may be at a logic low level. During the chip select period Chip Select, the nonvolatile memory device 120 latches a signal received through the plurality of data lines DQ as the chip select command CSC and the chip address CA at a rising edge of the write enable signal WE/. The above signal levels are exemplary, and the present disclosure is not limited thereto.

The nonvolatile memory device 120 may receive a first read command RD1 during the command input period CMD Input. Afterwards, the nonvolatile memory device 120 may receive an address ADDR during an address input period ADDR Input. Afterwards, the nonvolatile memory device 120 may receive a second read command RD2 during another command input period CMD Input.

In an embodiment, the first and second read commands RD1 and RD2 may be a command set (e.g., 00h and 30h) for a page read operation. In an embodiment, the address AD may be received during some periods (e.g., 5 periods) of the write enable signal WE/. However, the present disclosure is not limited thereto. The address AD may refer to a row address or a column address of a physical page that corresponds to a page where read data are stored.

In response to the second read command RD2, the nonvolatile memory device 120 may read data "D" corresponding to the received address AD from the memory cell array 121. For example, the nonvolatile memory device 120 may read the data "D" corresponding to the received address AD and may prepare the read data "D" in an input/output circuit. The above data preparation operation may be performed during a time period of Tr. In an embodiment, during the time period of Tr, the nonvolatile memory device 120 may provide a ready/busy signal R/B of a logic low level (e.g., a busy state) to the memory controller 110.

After the data preparation operation is completed, during the data output period DT Output, the nonvolatile memory device 120 may generate a data strobe signal DQS in response to the read enable signal RE/from the memory controller 110 and may output data "D" through the plurality of data lines DQ in synchronization with the data strobe signal DQS thus generated.

As described above, through the chip address initialization operation described with reference to FIGS. 1 to 14, a chip address of each of a plurality of nonvolatile memories may be allocated or initialized. Each of a plurality of nonvolatile memories sharing the chip enable signal CE/ may compare the chip address CA allocated thereto with a chip address received during the chip select period Chip Select and may determine whether to receive a command/address/data received through the plurality of data lines DQ as its own signal.

Figure 15:
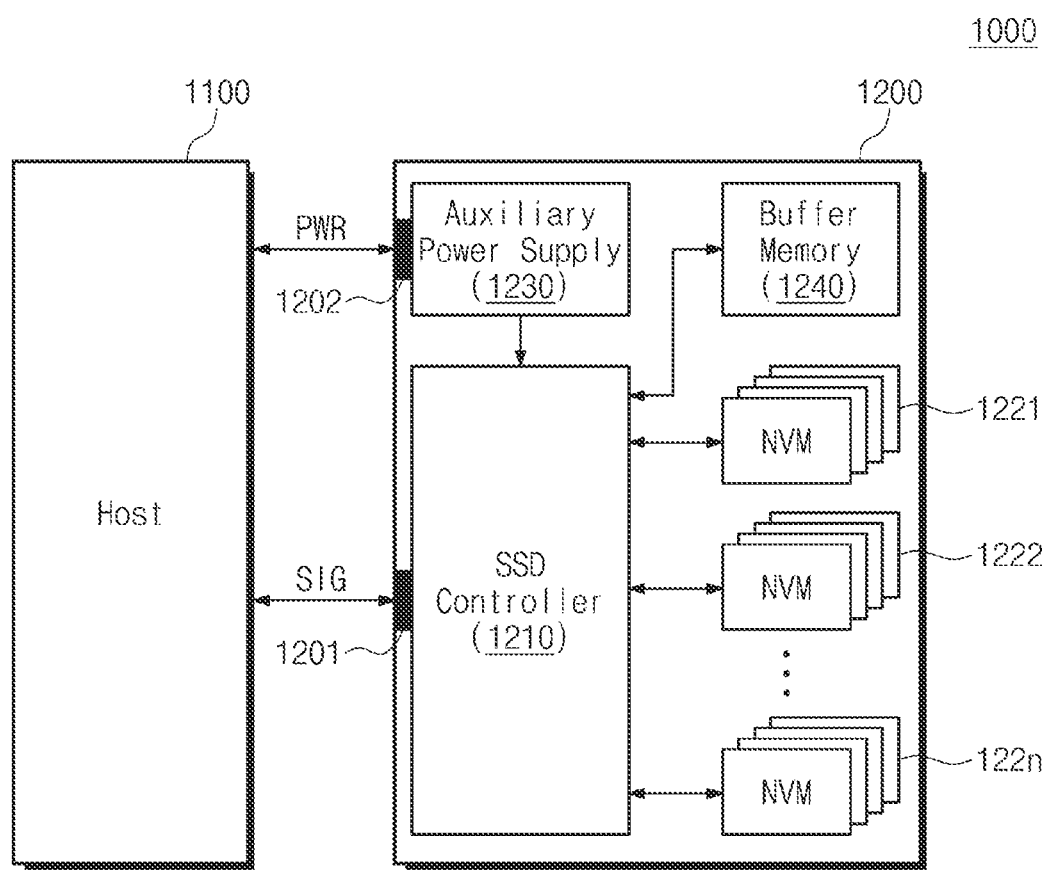
FIG. 15 is a block diagram illustrating a solid-state drive (SSD) system to which a storage system according to an embodiment of the present disclosure is applied.

FIG. 15 illustrates a solid-state drive (SSD) system to which a storage system according to an embodiment of the present disclosure is applied. Referring to FIG. 15, an SSD system 1000 includes a host 1100 and an SSD 1200.

The SSD 1200 exchanges signals SIG with the host 1100 through a signal connector 1201 and is supplied with a power PWR through a power connector 1202. The SSD 1200 includes an SSD controller 1210, a plurality of flash memories 1221 to 122*n*, an auxiliary power supply 1230, and a buffer memory 1240. In an embodiment, each of the plurality of flash memories 1221 to 122*n* may be implemented with a separate die or a separate chip. Each of the plurality of flash memories 1221 to 122n may be configured to initialize a chip address, such as described with reference to FIGS. 1 to 14.

The SSD controller 1210 may control the plurality of flash memories 1221 to 122n in response to the signals SIG received from the host 1100. The plurality of flash memories 1221 to 122n may operate under control of the SSD controller 1210. The auxiliary power supply 1230 is connected with the host 1100 through the power connector 1202. The auxiliary power supply 1230 may be charged by the power PWR supplied from the host 1100, without limitation thereto. When the power PWR is not smoothly supplied from the host 1100, the auxiliary power supply 1230 may power the SSD 1200.

Figure 16:
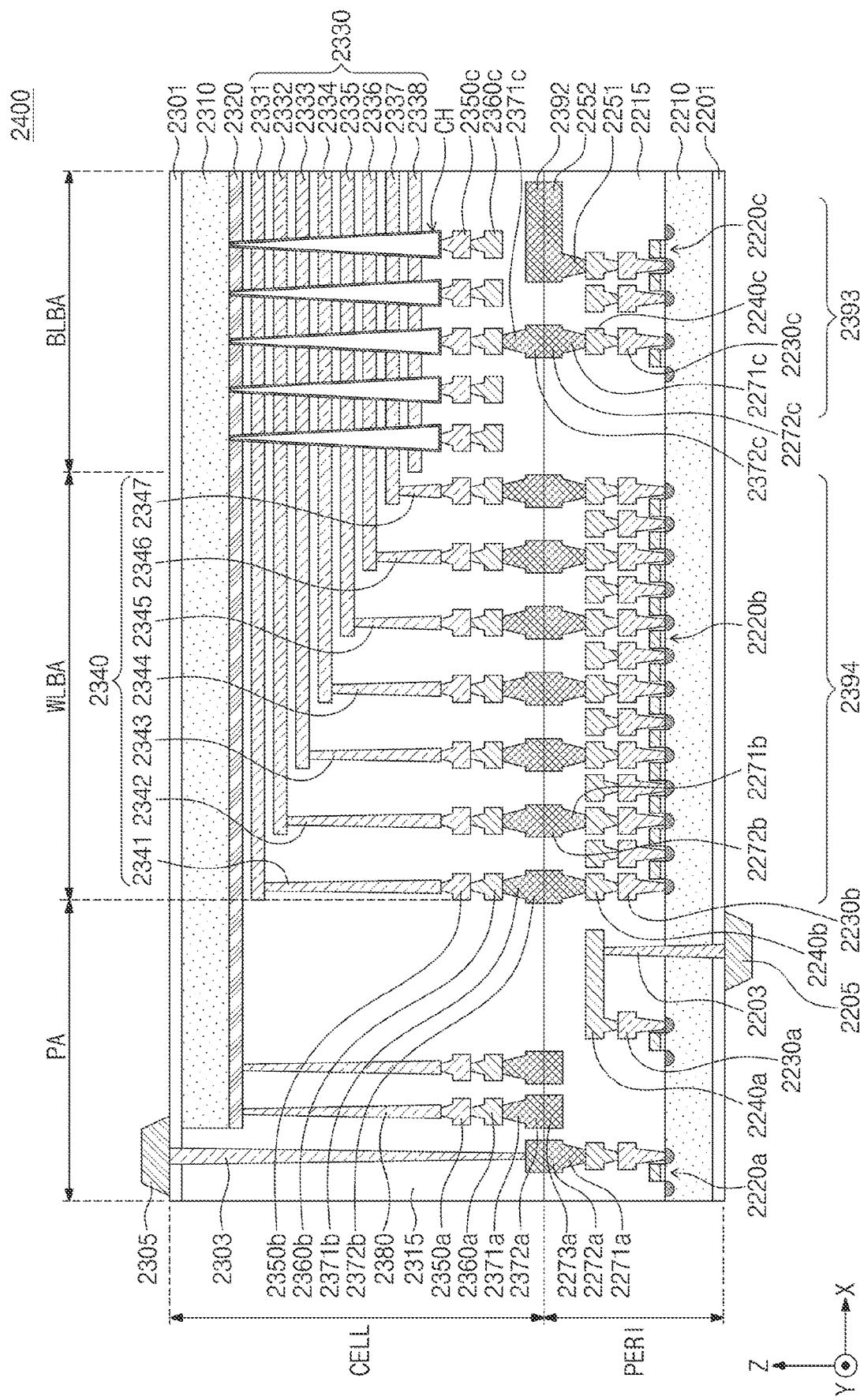
FIG. 16 is a schematic diagram illustrating a nonvolatile memory according to an embodiment of the present disclosure.

FIG. 16 illustrates a nonvolatile memory according to an embodiment of the present disclosure. Referring to FIG. 16, a nonvolatile memory 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer different from the first wafer, and then connecting the upper chip and the lower chip in a bonding manner. For example, the bonding manner may include a method of electrically connecting a bonding metal formed on a lowermost metal layer of the upper chip and a bonding metal formed on an uppermost metal layer of the lower chip. For example, when the bonding metals are formed of copper (Cu), the bonding manner may be a Cu—Cu bonding, and the bonding metals may also be formed of aluminum or tungsten.

Each of the peripheral circuit region PERI and the cell region CELL of the nonvolatile memory 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c respectively formed on the first metal layers 2230a, 2230b, and 2230c. In an embodiment, the first metal layers 2230a, 2230b, and 2230c may be formed of tungsten having a relatively high resistance, and the second metal layers 2240a, 2240b, and 2240c may be formed of copper having a relatively low resistance.

In an embodiment illustrated in FIG. 16, even though the first metal layers 2230a, 2230b, and 2230c and the second metal layers 2240a, 2240b, and 2240c are shown and described, the first metal layers 2230a, 2230b, and 2230c and the second metal layers 2240a, 2240b, and 2240c are not limited thereto, and one or more metal layers may be further formed on the second metal layers 2240a, 2240b, and 2240c. At least a part of the one or more metal layers formed on the second metal layers 2240a, 2240b, and 2240c may be formed of aluminum or the like having a higher resistance than those of copper forming the second metal layers 2240a, 2240b, and 2240c, but a lower resistance than those of tungsten forming the first metal layers 2230a, 2230b, and 2230c.

The interlayer insulating layer 2215 may be disposed on the first substrate 2210 and may cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

Also, the upper bonding metals 2371b and 2372b in the cell region CELL may be referred as first metal pads, and the lower bonding metals 2271b and 2272b in the peripheral circuit region PERI may be referred as second metal pads.

The cell region CELL may include at least one memory block. The cell region CELL may include a second substrate 2310, an interlayer insulating layer 2315, and a common source line 2320. On the second substrate 2310, a plurality of word lines 2331 to 2338 (e.g., 2330) may be stacked in a direction (e.g., a Z-axis direction) perpendicular to an upper surface of the second substrate 2310. String selection lines and a ground selection line may be arranged on and below the plurality of word lines 2330, respectively, and the plurality of word lines 2330 may be disposed between the string selection lines and the ground selection line.

Widths of the plurality of word lines 2330 in the X-axis direction may be different. As a distance from the first substrate 2210 of the peripheral circuit region PERI to the corresponding one of the plurality of word lines 2330 increases, a width of the corresponding one of the plurality of word lines 2330 decreases. Likewise, as a distance from the second substrate 2310 of the cell region CELL to the corresponding one of the plurality of word lines 2330 increases, a width of the corresponding one of the plurality of word lines 2330 increases.

In the bit line bonding area BLBA, a channel structure CH may extend in a direction perpendicular to the upper surface of the second substrate 2310 and may pass through the plurality of word lines 2330, the string selection lines, and the ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an embodiment, the bit line 2360c may extend in a first direction (e.g., a Y-axis direction) parallel to the upper surface of the second substrate 2310.

The interlayer insulating layer 2315 may be disposed on the second substrate 2310 and may cover the common source line 2320, the plurality of word lines 2330, a plurality of cell contact plugs 2340, the first metal layers 2350a, 2350b, and 2350c, and the second metal layers 2360a, 2360b, and 2360c. The interlayer insulating layer 2315 may include an insulating material such as silicon oxide, silicon nitride, or the like.

In an embodiment illustrated in FIG. 16, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (e.g., an X-axis direction) parallel to the upper surface of the second substrate 2310 and may be connected to a plurality of cell contact plugs 2341 to 2347 (e.g., 2340). The word lines 2330 and the cell contact plugs 2340 may be connected to each other at pads provided by at least some of the plurality of word lines 2330, which extend in the second direction with different lengths. A first metal layer 2350b and a second metal layer 2360b may be sequentially connected to an upper portion of each of the cell contact plugs 2340 connected to the word lines 2330. The cell contact plugs 2340 may be connected to the peripheral circuit region PERI by the upper bonding metals 2371b and 2372b of the cell region CELL and the lower bonding metals 2271b and 2272b of the peripheral circuit region PERI in the word line bonding area WLBA.

The cell contact plugs 2340 may be electrically connected to the circuit elements 2220b providing a row decoder 2394 in the peripheral circuit region PERI. In an embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like and may be electrically connected to the common source line 2320. A first metal layer 2350a and a second metal layer 2360a may be sequentially stacked on an upper portion of the common source line contact plug 2380. For example, an area in which the common source line contact plug 2380, the first metal layer 2350a, and the second metal layer 2360a are disposed may be defined as the external pad bonding area PA.

The input/output pads 2205 and 2305 may be disposed in the external pad bonding area PA. Referring to FIG. 16, a lower insulating film 2201 covering a lower surface of the first substrate 2210 may be formed below the first substrate 2210, and the first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203 and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

Referring to FIG. 16, an upper insulating film 2301 covering the upper surface of the second substrate 2310 may be formed on the second substrate 2310, and the second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303 and the lower bonding metals 2271a and 2272a of the peripheral circuit region PERI.

According to embodiments, the second substrate 2310 and the common source line 2320 need not be disposed in an area in which the second input/output contact plug 2303 is disposed. Also, the second input/output pad 2305 need not overlap the word lines 2330 in the third direction (e.g., the Z-axis direction). Referring to FIG. 16, the second input/output contact plug 2303 may be separated from the second substrate 2310 in a direction parallel to the upper surface of the second substrate 2310 and may pass through the interlayer insulating layer 2315 of the cell region CELL to be connected to the second input/output pad 2305.

According to embodiments, the first input/output pad 2205 and the second input/output pad 2305 may be selectively formed. For example, the nonvolatile memory 2400 may include only the first input/output pad 2205 disposed on the first substrate 2210 or the second input/output pad 2305 disposed on the second substrate 2310. Alternatively, the nonvolatile memory 2400 may include both the first input/output pad 2205 and the second input/output pad 2305.

A metal pattern in an uppermost metal layer may be provided as a dummy pattern or the uppermost metal layer may be absent, in each of the external pad bonding area PA and the bit line bonding area BLBA respectively included in the cell region CELL and the peripheral circuit region PERI.

In the external pad bonding area PA, the nonvolatile memory 2400 may include a lower metal pattern 2273a, which corresponds to an upper metal pattern 2372a formed in an uppermost metal layer of the cell region CELL and has the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI need not be connected to a contact. As in the above description, in the external pad bonding area PA, an upper metal pattern which corresponds to the lower metal pattern formed in an uppermost metal layer of the peripheral circuit region PERI and has the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

In addition, in the bit line bonding area BLBA, an upper metal pattern 2392, which corresponds to a lower metal pattern 2252 formed in the uppermost metal layer of the peripheral circuit region PERI and has the same shape as the lower metal pattern 2252 of the peripheral circuit region PERI, may be formed in an uppermost metal layer of the cell region CELL. A contact need not be formed on the upper metal pattern 2392 formed in the uppermost metal layer of the cell region CELL.

According to the present disclosure, a chip address may be initialized by using input/output pads, an enable input pad, and an enable output pad. Accordingly, because the number of pads may be minimized, a nonvolatile memory device is provided in which the area of a memory chip may be minimized. A corresponding nonvolatile memory, and an operation method of a memory controller, are further provided.

While the present disclosure has been described with reference to embodiments thereof, it will be apparent to those of ordinary skill in the pertinent art that various changes and modifications may be made thereto without departing from the scope and spirit of the present disclosure as set forth in the following claims.

What is claimed is:

1. A nonvolatile memory comprising:
a plurality of input/output pads;
an enable input pad;
an enable output pad; and
a chip address initialization circuit,
wherein the chip address initialization circuit is configured to:
receive a current chip address through the plurality of input/output pads;
store the current chip address in response to a current enable signal received through the enable input pad;
output a next enable signal through the enable output pad; and
output a next chip address through the plurality of input/output pads,
wherein an edge of the next enable signal is center-aligned with a window of the next chip address.

2. The nonvolatile memory of claim 1, wherein the chip address initialization circuit receives a chip address initialization command from an external memory controller through a plurality of data lines connected to the plurality of input/output pads.

3. The nonvolatile memory of claim 2, wherein the chip address initialization circuit identifies the chip address initialization command in response to a write enable signal.

4. The nonvolatile memory of claim 3, wherein, when a command latch enable signal received from the external memory controller is at a high level and an address latch enable signal received from the external memory controller is at a high level, the chip address initialization circuit identifies the chip address initialization command in response to the write enable signal.

5. The nonvolatile memory of claim 2, wherein, when the enable input pad is connected with a power supply voltage, the chip address initialization circuit stores the current chip address in response to a write enable signal.

6. The nonvolatile memory of claim 1, wherein, after a given time elapses from a time when the current chip address is received, the chip address initialization circuit outputs the next chip address through the plurality of input/output pads to a plurality of data lines.

7. The nonvolatile memory of claim 1, wherein the enable output pad is connected with an enable input pad of an external nonvolatile memory in which the next chip address is to be stored.

8. The nonvolatile memory of claim 1, wherein the enable input pad is connected with an enable output pad of an external nonvolatile memory that generates the current chip address.

9. The nonvolatile memory of claim 1, wherein the chip address initialization circuit includes:
a timing control circuit configured to output a clock signal, a data output enable signal, and the next enable signal;
a chip address register configured to receive the clock signal; and
a next chip address generator configured to receive the data output enable signal,
wherein the timing control circuit receives a chip address initialization command through a plurality of data lines connected to the plurality of input/output pads and generates the clock signal and the data output enable signal, which are based on the current enable signal or a write enable signal, in response to the chip address initialization command,
wherein the chip address register stores the current chip address in response to the clock signal and outputs the current chip address to the next chip address generator, and
wherein the next chip address generator generates the next chip address by using the current chip address from the chip address register and outputs the next chip address through the plurality of input/output pads in response to the data output enable signal.

10. A nonvolatile memory device comprising:
a plurality of nonvolatile memories connected with a plurality of data lines,
wherein a first nonvolatile memory of the plurality of nonvolatile memories includes:
a first plurality of input/output pads connected with the plurality of data lines;
a first enable input pad;
a first enable output pad; and
a first chip address initialization circuit,
wherein a second nonvolatile memory of the plurality of nonvolatile memories includes:
a second plurality of input/output pads connected with the plurality of data lines;
a second enable input pad;
a second enable output pad; and
a second chip address initialization circuit,
wherein each of the first and second chip address initialization circuits is configured to:
receive a current chip address through the plurality of input/output pads;
generate a next chip address by using the current chip address;
output a next enable signal through the corresponding enable output pad of the first and second enable output pads; and
output the next chip address through the plurality of input/output pads, and
wherein the first enable output pad and the second enable input pad are connected,
wherein the next enable signal is center-aligned with a window of the next chip address.

11. The nonvolatile memory device of claim 10,
wherein the first enable input pad is connected with a power supply voltage, and
wherein the first chip address initialization circuit stores a current chip address generated from an external memory controller, in response to a write enable signal.

12. The nonvolatile memory device of claim 10, wherein the second chip address initialization circuit stores a current chip address generated from the first nonvolatile memory, in response to a current enable signal received through the second enable input pad.

13. The nonvolatile memory device of claim 10, wherein each of the first and second chip address initialization circuits receives a chip address initialization command from an external memory controller through the plurality of input/output pads before receiving the current chip address.

14. The nonvolatile memory device of claim 13, wherein each of the first and second chip address initialization circuits identifies the chip address initialization command in response to a write enable signal.

15. The nonvolatile memory device of claim 10, wherein each of the first and second chip address initialization circuits generates a next chip address by adding the current chip address and a given value.

16. The nonvolatile memory device of claim 10, wherein an output pad of one nonvolatile memory of the plurality of nonvolatile memories is not connected with an enable input pad of another nonvolatile memory of the plurality of nonvolatile memories.

17. The nonvolatile memory device of claim 10, wherein in each of the first and second chip address initialization circuits, an edge of the next enable signal is center-aligned with a window of the next chip address.

18. An operation method of a memory controller which controls an external nonvolatile memory device including a plurality of nonvolatile memories connected with a plurality of data lines, the method comprising:
   transmitting a chip address initialization command through the plurality of data lines to the external nonvolatile memory device in synchronization with a write enable signal;
   transferring a first chip address through the plurality of data lines in synchronization with the write enable signal; and
   initializing a chip address of a first memory of the plurality of nonvolatile memories based on the first chip address,
   wherein a next chip address of each next memory of the plurality of nonvolatile memories is sequentially initialized based on an incremented chip address generated and transmitted from a previous memory of the plurality of nonvolatile memories when a transition of the next enable signal is center-aligned with a window of the next chip address, respectively.

19. The method of claim 18, further comprising:
checking whether a chip address of one of the plurality of nonvolatile memories is correctly initialized, after a chip address initialization operation is completed,
wherein the checking includes:
   transmitting a chip select command through the plurality of data lines;
   transmitting a chip address corresponding to one of the plurality of nonvolatile memories through the plurality of data lines;
   transmitting a status read command through the plurality of data lines;
   receiving status information through the plurality of data lines; and
   determining whether the chip address is correctly initialized, through the status information.

20. The method of claim 18,
wherein sequentially initializing each next chip address of each next memory is performed when an edge of the next enable signal is center-aligned with a window of the next chip address.

* * * * *